US011800712B2

(12) United States Patent
Jung et al.

(10) Patent No.: US 11,800,712 B2
(45) Date of Patent: Oct. 24, 2023

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Juyeon Jung, Suwon-si (KR); Kwanyong Kim, Uijeongbu-si (KR); Haemin Lee, Seoul (KR); Juyoung Lim, Seoul (KR); Wonseok Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 323 days.

(21) Appl. No.: 17/339,129

(22) Filed: Jun. 4, 2021

(65) Prior Publication Data
US 2022/0093638 A1 Mar. 24, 2022

(30) Foreign Application Priority Data
Sep. 22, 2020 (KR) .................. 10-2020-0122365

(51) Int. Cl.
| | |
|---|---|
| *H01L 27/11582* | (2017.01) |
| *H10B 43/27* | (2023.01) |
| *H10B 41/10* | (2023.01) |
| *H10B 41/27* | (2023.01) |
| *H10B 41/35* | (2023.01) |

(Continued)

(52) U.S. Cl.
CPC ............. *H10B 43/27* (2023.02); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ............................. H10B 43/27; H10B 43/20
See application file for complete search history.

(56) References Cited

U.S. PATENT DOCUMENTS

| | | | |
|---|---|---|---|
| 9,754,963 B1 | 9/2017 | Kawamura et al. | |
| 10,468,433 B2 | 11/2019 | Kim et al. | |

(Continued)

FOREIGN PATENT DOCUMENTS

| | | |
|---|---|---|
| CN | 109887919 A | 6/2019 |
| CN | 109920792 A | 6/2019 |
| KR | 10-2017-0142774 A | 12/2017 |

*Primary Examiner* — Christopher A Johnson
(74) *Attorney, Agent, or Firm* — Harness, Dickey & Pierce, P.L.C.

(57) ABSTRACT

A semiconductor memory device includes a substrate having a first region, a second region, and a third region main separation regions extending in the first direction and apart from each other in a second direction, first auxiliary separation regions extending in the first direction and spaced apart from each other in the second direction, and second auxiliary separation regions extending in the first direction and spaced apart from each other in the second direction. The first auxiliary separation regions are at a first pitch in the second direction between the main separation regions, the second auxiliary separation regions are disposed at a second pitch, smaller than the first pitch in the second direction between the main separation regions, and the first auxiliary separation regions and the second auxiliary separation regions are shifted from each other in the second direction.

20 Claims, 29 Drawing Sheets

(51) Int. Cl.
*H10B 41/40* (2023.01)
*H10B 43/10* (2023.01)
*H10B 43/35* (2023.01)
*H10B 43/40* (2023.01)

(56) References Cited

U.S. PATENT DOCUMENTS

| | | |
|---|---|---|
| 2017/0365616 A1 | 12/2017 | Kang et al. |
| 2018/0102314 A1* | 4/2018 | Kim .................... H01L 23/528 |
| 2019/0157283 A1 | 5/2019 | Jung et al. |
| 2020/0058671 A1 | 2/2020 | Kim et al. |
| 2020/0144287 A1 | 5/2020 | Jung et al. |

* cited by examiner

SEMICONDUCTOR DEVICE AND ELECTRONIC SYSTEM INCLUDING THE SAME

CROSS-REFERENCE TO RELATED APPLICATION(S)

This application claims benefit of priority under 35 U.S.C. § 119 to Korean Patent Application No. 10-2020-0122365 filed on Sep. 22, 2020 in the Korean Intellectual Property Office, the disclosure of which is incorporated herein by reference in its entirety.

BACKGROUND

Some example embodiments relate to a semiconductor device and/or an electronic system including the same.

In an electronic system that stores data, a semiconductor device capable of storing high-capacity data is desired. Accordingly, research into a method of increasing data storage capacity of a semiconductor device is ongoing. For example, a semiconductor device including three-dimensionally arranged memory cells, rather than two-dimensionally arranged memory cells, has been proposed as a method of increasing data storage capacity of a semiconductor device.

SUMMARY

Some example embodiments provide a semiconductor device having improved reliability.

Alternatively or additionally, some example embodiments provide an electronic system including a semiconductor device having improved reliability.

According to some example embodiments, a semiconductor device includes a substrate having a first region, a second region, and a third region, a first stack structure including first gate electrodes stacked to be spaced apart from each other, and first interlayer insulating layers alternately stacked with the first gate electrodes, a second stack structure on the first stack structure and including second gate electrodes and second interlayer insulating layers stacked alternately with the second gate electrodes; the second gate electrodes stacked to be spaced apart from each other in the first region and extending in a first direction while arranged in a staircase shape in the first direction, the staircase shape in the second region and the third region, main separation regions in the first to third regions, the main separation regions penetrating the first and second stack structures, the main separation regions extending in the first direction and spaced apart from each other in a second direction that is perpendicular to the first direction, first auxiliary separation regions in the first and second regions, the first auxiliary separation regions penetrating the first and second stack structures between the main separation regions, the first auxiliary regions extending in the first direction and spaced apart from each other in the second direction, second auxiliary separation regions in the third region, the second auxiliary separation regions penetrating the first and second stack structures between the main separation regions, the second auxiliary separation regions extending in the first direction and spaced apart from each other in the second direction, first channel structures and second channel structures, each of the first channel structures and second channel structures including a channel layer and having a first width, the first channel structures and the second channel structures penetrating the first stack structure and the second stack structure, respectively, and dummy structures penetrating the first and second stack structures and having a second width greater than the first width. The first auxiliary separation regions are arranged at a first pitch in the second direction between the main separation regions, and the second auxiliary separation regions are arranged at a second pitch in the second direction between the main separation regions, the second pitch less than the first pitch.

According to some example embodiments, a semiconductor device includes a substrate having a first region, a second region, and a third region, a stack structure including a plurality of gate electrodes stacked and spaced apart from each other on the first region and extending in a first direction while arranged in a staircase shape on the second region and on the third region, channel structures, each penetrating through the stack structure and including a channel layer, main separation regions in the first to third regions, the main separation regions penetrating the stack structure, extending in the first direction, and spaced apart from each other in a second direction that is perpendicular to the first direction, first auxiliary separation regions in the first region and the second region, the first auxiliary separation regions penetrating the stack structure between the main separation regions, extending in the first direction, and spaced apart from each other in the second direction, second auxiliary separation regions in the third region, the second auxiliary separation regions penetrating the stack structure between the main separation regions, extending in the first direction, and spaced apart from each other in the second direction, and first lower separation regions between the main separation regions and penetrating at least one gate electrode, the at least one gate electrode including a lowermost gate electrode among the gate electrodes, the first lower separation regions between at least one of the first auxiliary separation regions and one of the second auxiliary separation regions that is adjacent to the at least one of the first auxiliary separation regions and connecting the at least one of the first auxiliary separation regions with the one of the second auxiliary separation regions. The first auxiliary separation regions are arranged at a first pitch in the second direction between the main separation regions, the second auxiliary separation regions are arranged at a second pitch, less than the first pitch, in the second direction between the main separation regions, and the first auxiliary separation regions and the second auxiliary separation regions are shifted from each other in the second direction.

According to some example embodiments, an electronic system includes a semiconductor storage device including a first substrate, active or passive circuits on the first substrate, a second substrate on the active or passive circuits and having a first region, a second region, and a third region, a stack structure including a plurality of gate electrodes stacked and spaced apart from each other on the second substrate of the first to third regions and extending in a first direction and arranged in a staircase shape in the first direction, the staircase shape in the second region and the third region, the stack structure including first interlayer insulating layers alternately stacked with the gate electrode, channel structures, each penetrating the stack structure and including a channel layer, main separation regions penetrating the stack structure, the main separation regions extending in the first direction, and spaced apart from each other in a second direction, perpendicular to the first direction, the main separation regions on the second substrate on the first to third regions, first auxiliary separation regions penetrating the stack structure between the main separation regions, the first auxiliary separation regions extending in the first direction, and spaced apart from each other in the second direction, the first auxiliary separation regions in the first region and the second region, second auxiliary separation regions penetrating the stack structure between the main separation regions, the second auxiliary separation regions extending in the first direction and spaced apart from each other in the second direction, the second auxiliary separation regions in the third region, first lower separation regions between the main separation regions and penetrating at least one gate electrode, the at least one gate electrode including a lowermost gate electrode from among the plurality of gate electrodes, the first lower separation regions between at least one of the first auxiliary separation regions and one of the second auxiliary separation regions that is adjacent to the at least one of the first auxiliary separation regions and connecting the at least one of the first auxiliary separation regions with the one of the second auxiliary separation regions, an input/output pad electrically connected to the active or passive circuits, and a controller circuitry electrically connected to the semiconductor storage device through the input/output pad and configured to control the semiconductor storage device. In the semiconductor storage device, the first auxiliary separation regions are arranged at a first pitch in the second direction between the main separation regions, and the second auxiliary separation regions are arranged at a second pitch, less than the first pitch, in the second direction between the main separation regions.

BRIEF DESCRIPTION OF DRAWINGS

The above and other aspects, features, and advantages of example embodiments will be more clearly understood from the following detailed description, taken in conjunction with the accompanying drawings.

DETAILED DESCRIPTION OF SOME EXAMPLE EMBODIMENTS

Hereinafter, some example embodiments will be described with reference to the accompanying drawings.

Figure 1:
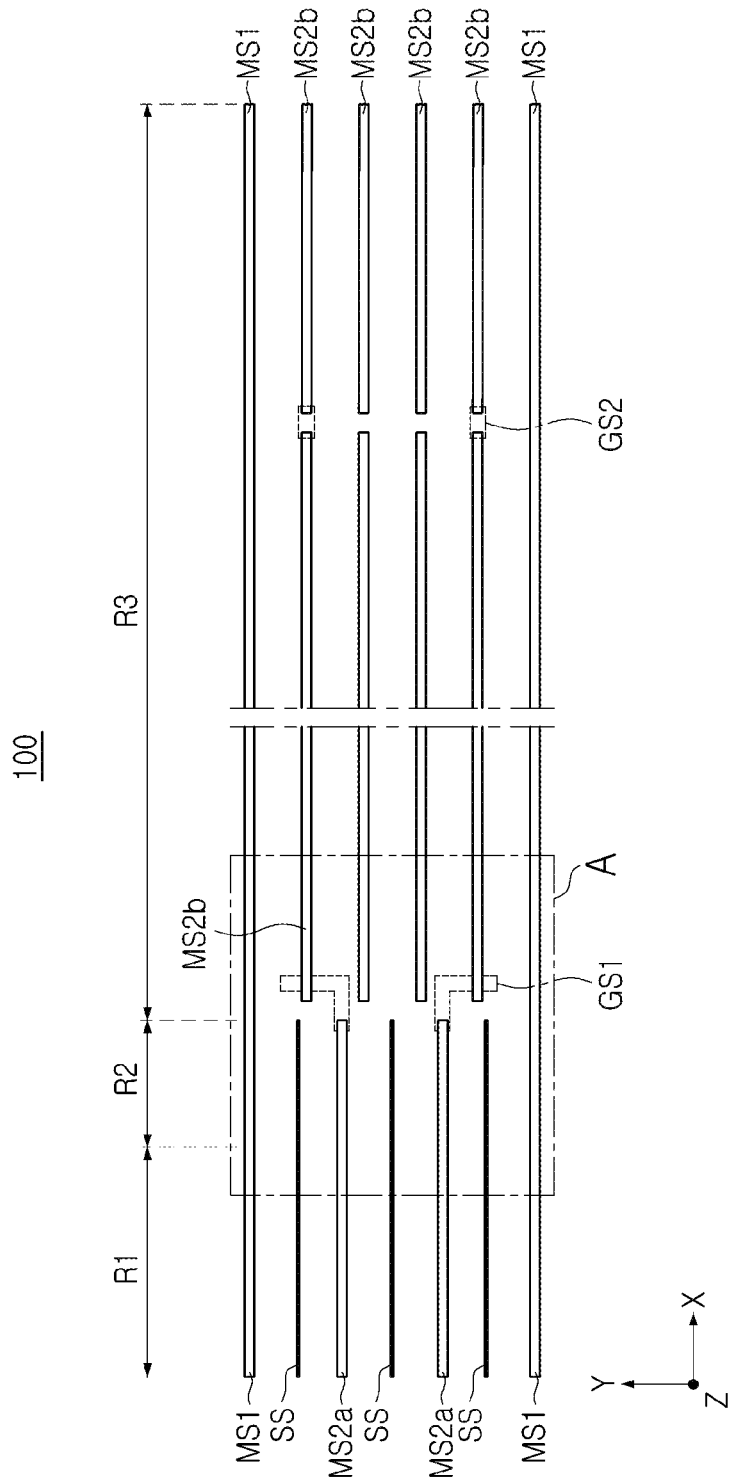
FIGS. 1 to 3 are schematic plan views of a semiconductor device according to some example embodiments.
Figure 2:
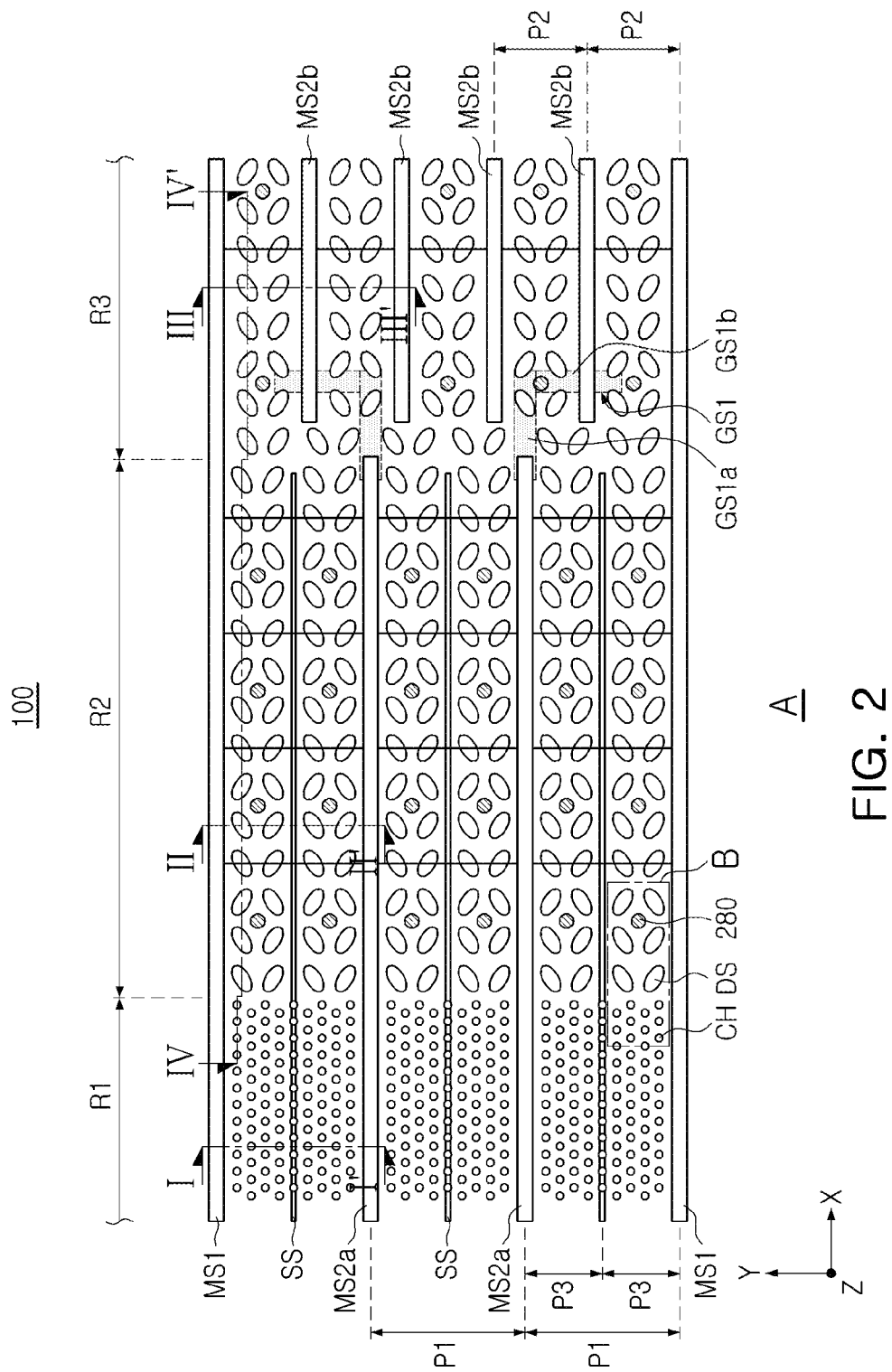
Figure 3:
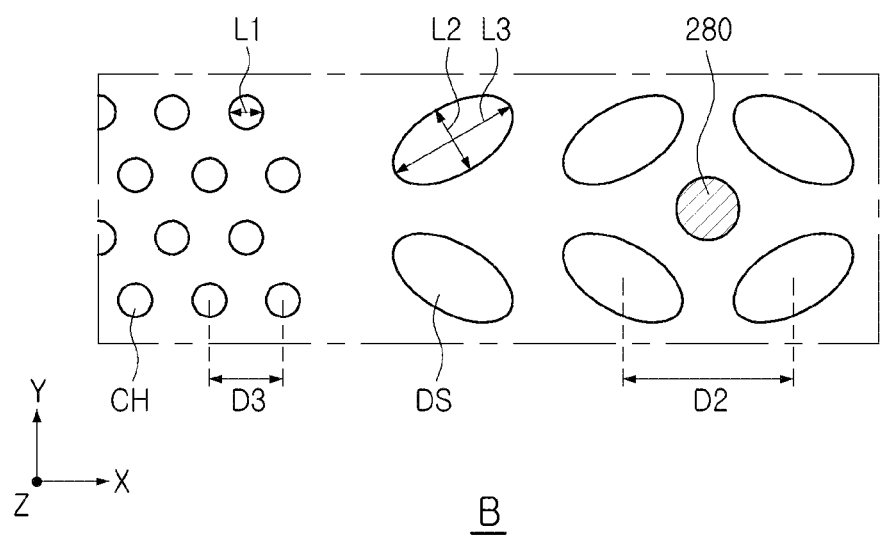

FIGS. 1 to 3 are schematic plan views of a semiconductor device according to some example embodiments. FIG. 2 is an enlarged view of region 'A' of FIG. 1, and FIG. 3 is an enlarged view of region 'B' of FIG. 2.

Figure 4:
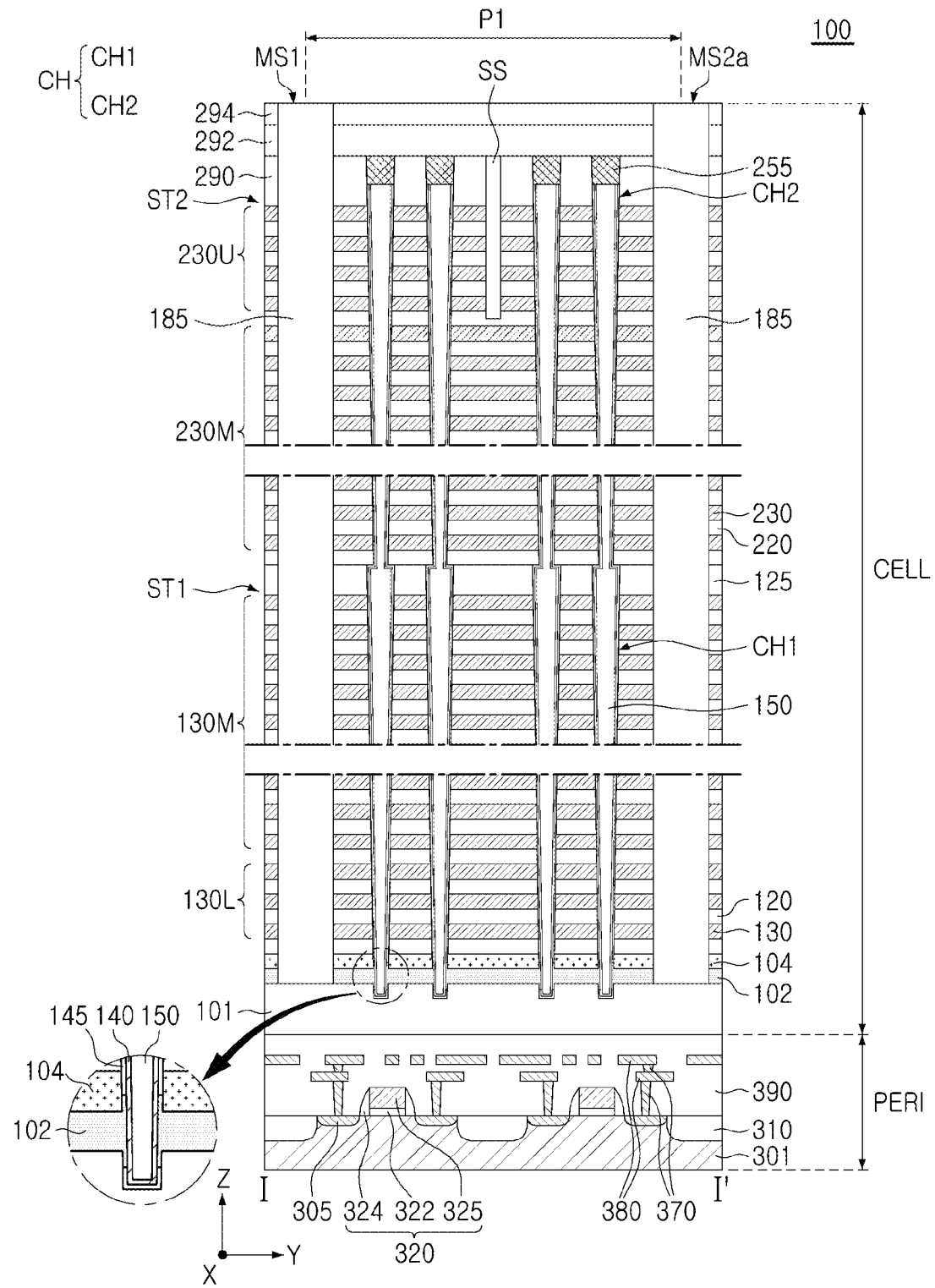
FIGS. 4 to 7 are schematic cross-sectional views of a semiconductor device according to some example embodiments.
Figure 5:
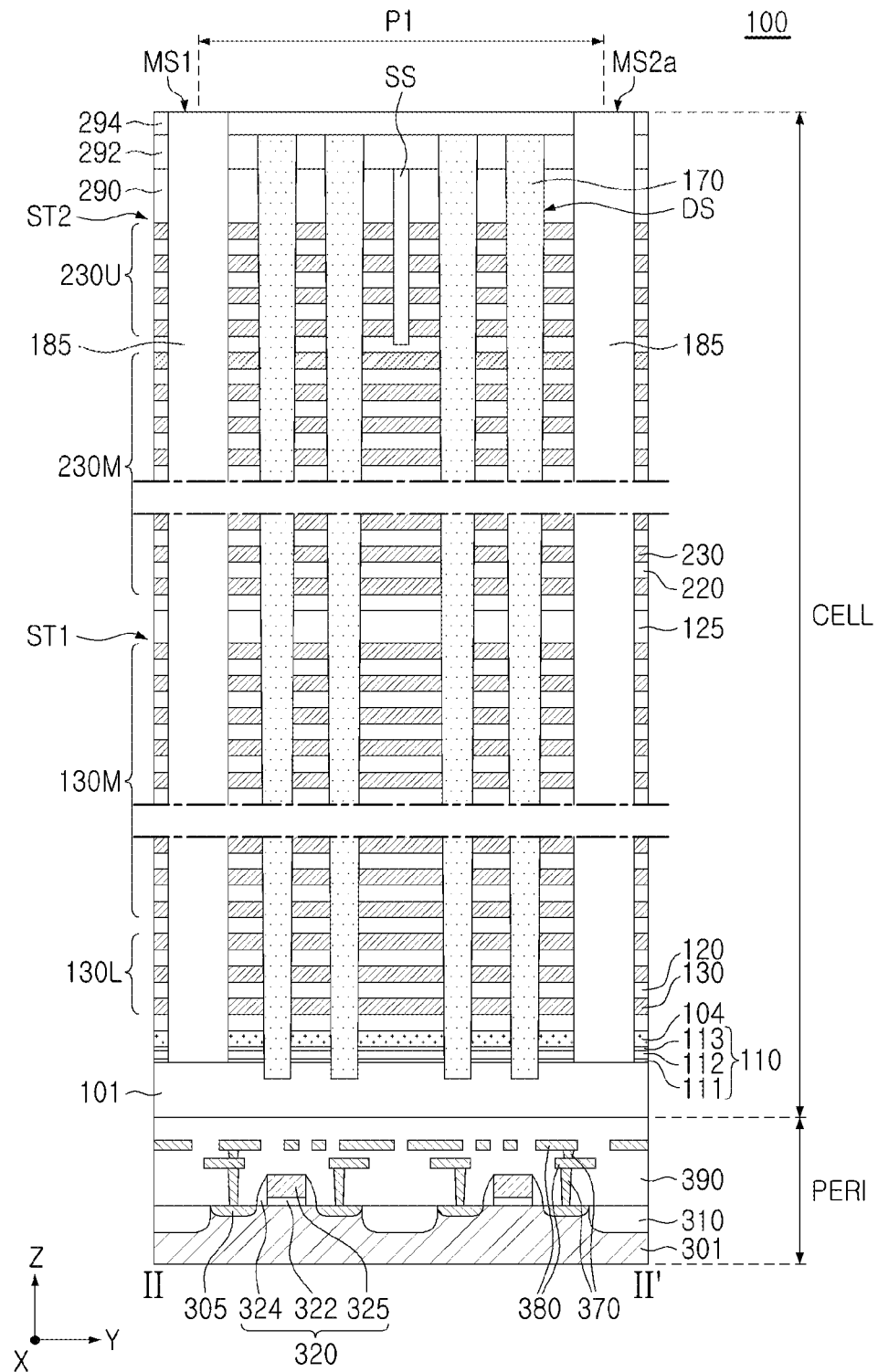
Figure 6:
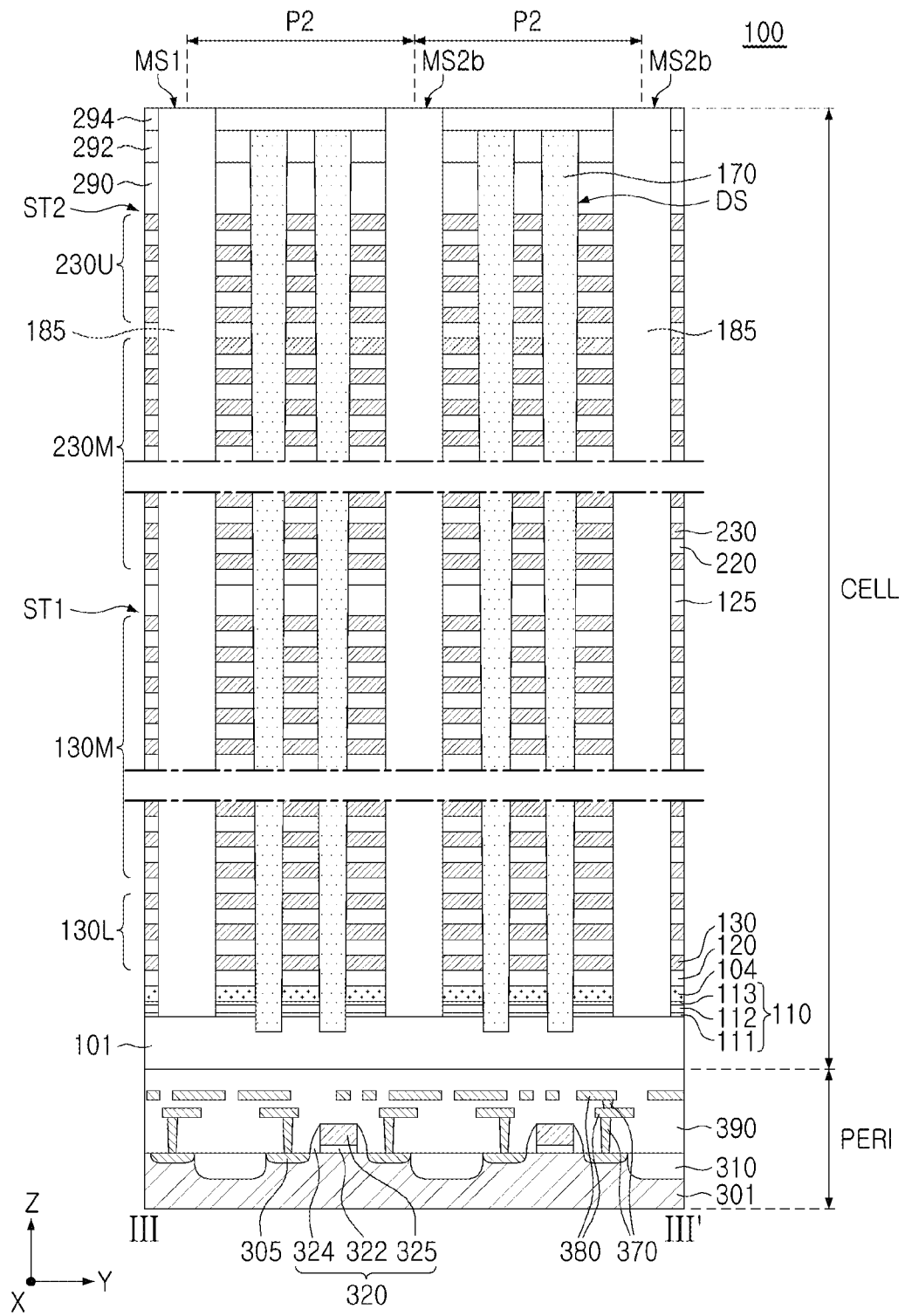
Figure 7:
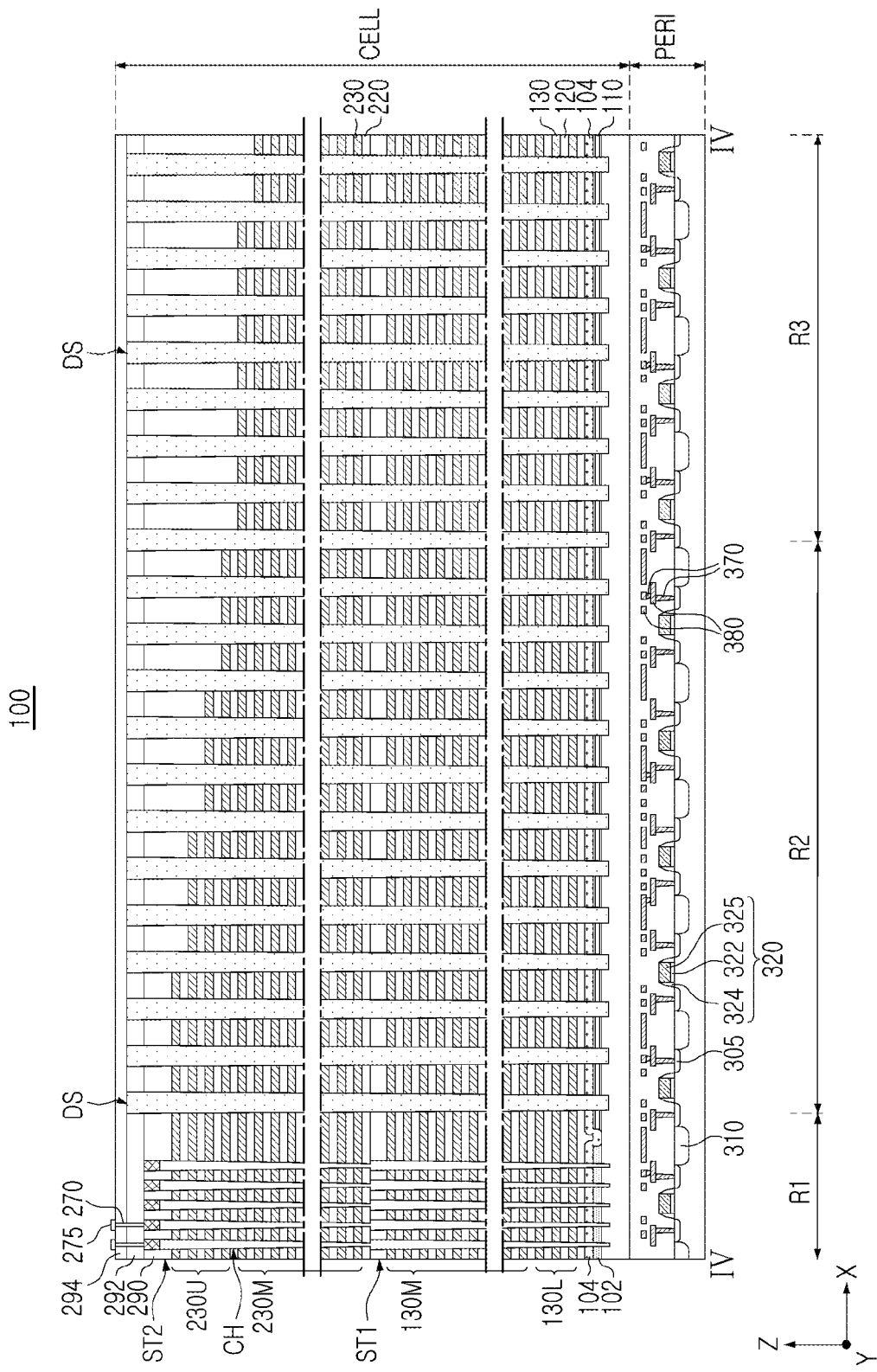

FIGS. 4 to 7 are schematic cross-sectional views of a semiconductor device according to some example embodiments. FIG. 4 is a cross-sectional view taken along line I-I' of FIG. 2, FIG. 5 is a cross-sectional view taken along line II-IT of FIG. 2, FIG. 6 is a cross-sectional view taken along line III-III' of FIG. 2, and FIG. 7 is a cross-sectional view taken along line IV-IV' of FIG. 2

Referring to FIGS. 1 to 7, a semiconductor device 100 may include a peripheral circuit structure PERI, including a base substrate 301, and a memory cell structure CELL including the substrate 101. The memory cell structure CELL or portions of the memory cell structure CELL may be disposed above the peripheral circuit structure PERI. Alternatively or additionally, in some example embodiments, the memory cell structure CELL or portions of the memory cell structure CELL may be disposed below the peripheral circuit structure PERI. Alternatively or additionally, in some example embodiments, the memory cell structure CELL and the peripheral circuit structure PERI may be bonded to each other by, for example, copper-to-copper (Cu-to-Cu) bonding.

The peripheral circuit structure PERI may include the base substrate 301, source/drain regions 305 and device isolation layers 310 in the base substrate 301, circuit elements 320, circuit contact plugs 370, circuit interconnection lines 380, and a peripheral insulating layer 390 disposed on the base substrate 301.

The base substrate 301 may have an upper surface extending in a direction X and a direction Y. An active region may be defined in the base substrate 301 by the device isolation layers 310. Source/drain regions 305, including impurities such as at least one of boron, phosphorus, arsenic, or carbon, may be disposed in a portion of the active region. The base substrate 301 may be a single-crystal structure, or a polycrystalline structure, and may include a semiconductor material, for example, at least one of a group IV semiconductor, a group III-V compound semiconductor, or a group II-VI compound semiconductor. The base substrate 301 may be provided as a bulk wafer or an epitaxial layer.

The circuit elements 320 may include active circuits such as a planar transistor and/or a three-dimensional transistor. Alternatively or additionally the circuit elements 320 may include a diode. Alternatively or additionally, the circuit elements 320 may include passive circuits, such as at least one of a resistor, a capacitor, or an inductor. The circuit elements 320 may be single-terminal, and/or may have two terminals, and/or may have three terminals, and/or may have more than three terminals. The circuit elements 320 may be linear, and/or may be non-linear. Each of or at least one of the circuit elements 320 may include a circuit gate dielectric layer 322, a spacer layer 324, and a circuit gate electrode 325. The source/drain regions 305 may be disposed in the base substrate 301 on opposite sides adjacent to the circuit gate electrode 325.

The peripheral insulating layer 390 may be disposed on the circuit device 320 on the base substrate 301. The circuit contact plugs 370 may penetrate through the peripheral insulating layer 390 to be connected to the source/drain regions 305. An electrical signal may be applied to the circuit element 320 by the circuit contact plugs 370. In a region, not illustrated, the circuit contact plugs 370 may also be connected to the circuit gate electrode 325. The circuit interconnection lines 380 may be connected to the circuit contact plugs 370 and may be disposed as a plurality of layers. The circuit contact plugs 370 may connect to one of the circuit gate electrodes 325, one source/drain region 305 on one side of the circuit gate electrodes 325, and to another source/drain region 305 on another side of a circuit gate electrode 325; however, example embodiments are not limited thereto.

The memory cell structure CELL may include a substrate 101 having a first region R1, a second region R2, and a third region R3. The memory cell structure CELL may have a first stack structure ST1 and a second stack structure ST2 stacked on the substrate 101, a first channel structure CH1 and a second channel structure CH2, respectively penetrating through the first and second stack structures ST1 and ST2, and a dummy structure DS penetrating through the first and second stack structures ST1 and ST2. The memory cell structure CELL may further include main separation regions MS1 penetrating through the first and second stack structures ST1 and ST2, extending in the direction X, and disposed to be spaced apart from each other in the direction Y, first auxiliary separation regions MS2a penetrating through the first and second stack structures ST1 and ST2 between the main separation regions MS1, extending in the direction X, and spaced apart from each other in the direction Y, second auxiliary separation regions MS2b penetrating through the first and second stack structures ST1 and ST2 between the main separation regions MS, extending in the direction X, disposed to be spaced apart from each other in the direction Y, and disposed to be shifted from the first auxiliary separation regions MS2a in the direction Y, and upper separation regions SS penetrating through a portion of an upper portion of each of the first and second stack structures ST1 and ST2 and disposed alternately with the first auxiliary separation regions MS2a in the direction Y. The memory cell structure CELL may further include lower separation regions GS1 and GS2 penetrating a portion of a lowermost gate electrode 130.

The first region R1 of the substrate 101 may be or include a region in which the gate electrodes 130 and 230 are vertically stacked and the channel structures CH are disposed, and may be or include a region in which memory cells are disposed. The second region R2 and the third region R3 of the substrate 101 may be or include regions in which the gate electrodes 130 extend by different lengths, and may be referred to as staircase regions. The second and/or third regions R2 and R3 may correspond to regions for electrically connecting the memory cells to the peripheral circuit structure PERI. The second region R2 and/or the third region R3 may be disposed on at least one end of the first region R1 in at least one direction, for example, the direction X. The second region R2 may correspond to an upper portion of the staircase region, and may correspond to a region in which a shape of a step, formed by the gate electrodes 130 and 230 to be described later, starts or begins. The first auxiliary separation regions MS2a and the second auxiliary separation regions MS2b may be alternately disposed on a boundary between the second region R2 and the third region R3. The second auxiliary separation regions MS2b disposed to be shift from the first auxiliary separation regions MS2a on a boundary between the second region R2 and the third region R3. In some example embodiments, the second region R2 may be a region in which end portions of the upper gate electrodes 230U, constituting a string select transistor, are disposed. In some example embodiments, the gate electrodes 130 and 230 may be upwardly exposed in the second region R2 and the third region R3 to be connected to the contact plugs 280. The third region R3 may be a staircase region, other than the region in which the end portions of the upper gate electrodes 230U are disposed. The gate electrodes 130 and 230 may include a first gate electrode 130, constituting the first stack structure ST1, and a second gate electrode 230 constituting the second stack structure ST2.

The substrate 101 may have an upper surface extending in the direction X and the direction Y. The substrate 101 may include a semiconductor material such as a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be provided as a polycrystalline semiconductor layer, such as a doped or undoped polysilicon layer, and/or may be provided as an epitaxial layer.

A first horizontal conductive layer 102 and a second horizontal conductive layer 104 may be sequentially stacked to be disposed on an upper surface of the first region R1 of the substrate 101. The first horizontal conductive layer 102 may not extend to the second and third regions R2 and R3 of the substrate 101, while the second horizontal conductive layer 104 may extend to the second and third regions R2 and R3.

The first horizontal conductive layer 102 may serve as a portion of a common source line of the semiconductor device 100. For example, the first horizontal conductive layer 102 may serve as a common source line, together with the substrate 101. As illustrated in FIG. 4, the first horizontal conductive layer 102 may be directly connected to a channel layer 140 on a circumference of the channel layer 140.

As illustrated in FIG. 7, the second horizontal conductive layer 104 may be is in contact with the substrate 101 in some regions in which the first horizontal conductive layer 102 and a horizontal insulating layer 110 are not disposed. The second horizontal conductive layer 104 may be bent, while covering an end portion of the first horizontal conductive layer 102 or the horizontal insulating layer 110, to extend upwardly of the substrate 101.

The first and second horizontal conductive layers 102 and 104 may include a semiconductor material. For example, both the first and second horizontal conductive layers 102 and 104 may include polysilicon. In this case, at least the first horizontal conductive layer 102 may be a doped layer, and the second horizontal conductive layer 104 may be a doped layer or a layer including impurities diffused from the first horizontal conductive layer 102. However, in some example embodiments, the second horizontal conductive layer 104 may be replaced with an insulating layer.

The horizontal insulating layer 110 may be disposed on the substrate 101 in parallel to the first horizontal conductive layer 102 in at least a portion of the second region R2 and the third region R3. As illustrated in FIGS. 5 and 6, the horizontal insulating layer 110 may include first to third insulating layers 111, 112, and 113 sequentially stacked on the second region R2 and the third region R3 of the second substrate 101. The horizontal insulating layer 110 may be layers remaining after a portion of the horizontal insulating layer 110 is replaced with the first horizontal conductive layer 102 in a process of manufacturing the semiconductor device 100.

The horizontal insulating layer 110 may include a silicon oxide, a silicon nitride, a silicon carbide, or a silicon oxynitride. The first and third horizontal insulating layers 111 and 113 and the second horizontal insulating layer 112 may include different insulating materials. The first and third horizontal insulating layers 111 and 113 may include the same material. For example, the first and third horizontal insulating layers 111 and 113 may be formed of the same material as the interlayer insulating layers 120, and the second horizontal insulating layer 112 may be formed of the same material as the first sacrificial insulating layers 118.

The first stack structure ST1 may include first interlayer insulating layers 120 and first gate electrodes 130 alternately stacked on the substrate 101. The second stack structure ST2 may include second interlayer insulating layers 220 and second gate electrodes 230 alternately stacked on the first stack structure ST1.

The gate electrodes 130 and 230 may include a lower gate electrode 130L constituting a gate of a ground select transistor, memory gate electrodes 130M and 230M constituting a plurality of memory cells, and upper gate electrodes 230U constituting gates of the string select transistors. The number of memory gate electrodes 130M and 230M, constituting memory cells, may be determined depending on capacity of the semiconductor device 100. According to embodiments, the number of upper gate electrodes 230U and the number of lower gate electrodes 130L may each be one to four, or more than four. In addition, the upper and low gate electrodes 230U and 130L may have the same structure as the memory gate electrodes 130M and 230M, or may have a structure different from a structure of the memory gate electrodes 130M and 230M. In some example embodiments, the first and second gate electrodes 130 and 230 may further include gate electrodes 130 and 230 disposed above the upper gate electrodes 230U and/or below the lower gate electrode 130L and constituting an erase transistor used in an erase operation using gate-induced drain leakage (GIDL). Some of the gate electrodes 130 and 230, for example, memory gate electrodes 130M and 230M, adjacent to the upper or lower gate electrodes 230U and 130L, may be dummy gate electrodes.

The gate electrodes 130 and 230 may be vertically stacked to be spaced apart from each other, and may extend by different lengths on at least one region to constitute a stepped structure having a staircase shape. As illustrated in FIG. 7, the second gate electrodes 230 may be stacked to be spaced apart from each other in the first region R1 and may extend in the form of a staircase in the direction X in the second region R2 and the third region R3. For example, the second gate electrodes 230 may form a stepped structure between the second gate electrodes 230 in the direction X. In a region, not illustrated, the first gate electrode 130 may extend in the form of a staircase in the direction X in the third region R3. In some example embodiments, among the gate electrodes 130 and 230, a predetermined number of, for example, two to five gate electrodes 130 and 230 may constitute a single gate group to form a stepped structure between the gate groups in the direction X. In this case, the gate electrodes 130 and 230, constituting the single gate group, may also be disposed to have a stepped structure in the direction Y. Due to the stepped structure, the gate electrodes 130 and 230 may have a staircase shape in which the lower gate electrodes 130 and 230 extend further than the upper gate electrodes 130 and 230, and may provide end portions exposed upwardly of the interlayer insulating layer 120 and 220. The gate electrodes 130 and 230 may be connected to the contact plugs 280 on the end portions. Thus, the first and second gate electrodes 130 and 230 may be connected to an upper interconnection structure. In some example embodiments, the gate electrodes 130 and 230 may each have a thickness increased on the end portions.

The first and second gate electrodes 130 and 230 may include a metallic material, for example, tungsten (W). According to some example embodiments, the gate electrodes 130 and 230 may include polysilicon and/or a metal silicide material. In some example embodiments, the gate electrodes 130 and 230 may further include a diffusion barrier. For example, the diffusion barrier may include tungsten nitride (WN), tantalum nitride (TaN), titanium nitride (TiN), or combinations thereof. A material composition, a thickness, and/or a number of the first gate electrodes 130 may be the same as or may be different from that of the second gate electrodes 230.

The interlayer insulating layers 120 and 220 may include a first interlayer insulating layer 120, constituting the first stack structure ST1, and a second interlayer insulating layer 220 constituting the second stack structure ST2. The first interlayer insulating layers 120 may be disposed between the first gate electrodes 130, and the second interlayer insulating layers 220 may be disposed between the second gate electrodes 230. Similarly to the gate electrodes 130 and 230, the interlayer insulating layers 120 and 220 may be spaced apart from each other in a direction, perpendicular to the upper surface of the substrate 101, and may be disposed to extend in the direction X. Each of the interlayer insulating layers 120 and 220 may include an insulating material such as a silicon oxide and/or a silicon nitride. An intermediate insulating layer 125, having a relatively great thickness, may be disposed on an uppermost portion of the first stack structure ST1. A material composition, a thickness, and/or a number of the interlayer insulating layers 120 be the same as or may be different from that of the interlayer insulating layers 220.

The main separation regions MS1, the first auxiliary separation regions MS2a, and the second auxiliary separation regions MS2b may be disposed extending in the direction X through the first and second stack structures ST1 and ST2. The main separation regions MS1 and the auxiliary separation regions MS2a and MS2b may be disposed to be parallel to each other. The main separation regions MS1 and the first and second auxiliary separation regions MS2a and MS2b may penetrate through the entire gate electrodes 130 and 230, stacked on the substrate 101, to be connected to the substrate 101. The main separation regions MS1 extend as a single region in the direction X, and the first and second auxiliary separation regions MS2a and MS2b may intermittently extend between a pair of main separation regions MS1 or may be disposed on only a certain region.

The first auxiliary separation regions MS2a may extend in the direction X in the first region R1 and the second region R2, and the second auxiliary separation regions MS2b may extend in the direction X in the third region R3. In some example embodiments, the first auxiliary separation regions MS2a may extend in the direction X in a region in which memory cells are disposed, and a region in which end portions of the upper gate electrodes 230U, constituting or corresponding to the string select transistor, are disposed.

The first auxiliary separation regions MS2a and the second auxiliary separation regions MS2b may be disposed to be spaced apart from each other on a boundary between the second region R2 and the third region R3. The first auxiliary separation regions MS2a and the second auxiliary separation regions MS2b may be alternately disposed in the direction X. The first auxiliary separation regions MS2a and the second auxiliary separation regions MS2*b* may be disposed to be shifted from each other in the direction Y.

As illustrated in FIG. 2, the first auxiliary separation regions MS2*a* may be arranged at a first pitch P1 in the direction Y between a pair of main separation regions MS1, and the second auxiliary separation regions MS2*b* may be arranged at a second pitch P2, having a size different from a size of the first pitch P1, in the direction Y between the pair of main separation regions MS1. In the specification, the term "pitch" refers to a length, e.g. the minimum length from a center of one component to a center of another component. In some example embodiments, the second auxiliary separation regions MS2*b* may be arranged at the second pitch P2, smaller than the first pitch P1, between the pair of main separation regions MS1. A distance P2 from a center of the main separation region MS1 to a center of the second auxiliary separation region MS2*b* may be greater than a distance P3 from the center of the main separation region MS1 to a center of the upper separation region SS. A distance P2 between centers of the second auxiliary separation region MS2*b* may be greater than a distance P3 from the center of the main separation region MS1 to the center of the upper separation region SS. The distance P2 between the centers of the second auxiliary separation region MS2*b* may be greater than a distance from the center of the first auxiliary separation region MS2*a* to the center of the upper separation region SS. In some example embodiments, the number and/or arrangement of the first auxiliary separation regions MS2*a* and the second auxiliary separation regions MS2*b* are not limited to what is illustrated in FIG. 1, and may be changed in various ways. Accordingly, relative sizes of the first pitch P1 and the second pitch P2 may be changed in various ways. Additionally or alternatively, a ratio of the first pitch P1 and the second pitch P2 may a rational ratio, e.g. a ratio such as one of 1/2, 1/3 or 2/3, 1/4 or 3/4, 1/5, 2/5, 3/5, 4/5, etc.; however, example embodiments are not limited thereto, and the ratio of the first pitch P1 to the second pitch P2 may be irrational.

As illustrated in FIGS. 4 to 6, an isolation insulating layer 185 may be disposed in the main separation regions MS1 and the first and second auxiliary separation regions MS2*a* and MS2*b*. The isolation insulating layer 185 may have a high aspect ratio, e.g. a high ratio between a height in the direction Z and a diameter or length in either or both of directions X and Y, resulting in a shape in which a width of the isolation insulating layer 185 tapers, e.g. decreases in a direction toward the substrate 101. However, example embodiments are not limited thereto, and the isolation insulating layer 185 may have a side surface, perpendicular to the upper surface of the substrate 101. In some example embodiments, a conductive layer may be further disposed in the isolation insulating layer 185 in the main separation regions MS1 and the first and second separation regions MS2*a* and MS2*b*. Accordingly, the conductive layer may serve as a common source line of the semiconductor device 100 and/or a contact plug connected to the common source line.

As illustrated in FIGS. 1 and 2, the upper separation regions SS may extend in the direction X between the main separation regions MS1 and the second auxiliary separation regions MS2*a* and between the second auxiliary separation regions MS2*a* in the first and second regions R1 and R2. The upper separation regions SS may be disposed to penetrate through a portion of the second gate electrodes 230 including an uppermost gate electrode 230U, among the gate electrodes 130 and 230. As illustrated in FIGS. 4 and 5, the upper separation regions SS may separate a total of, for example, four second gate electrodes 230, including upper gate electrodes 230U, from each other in the direction Y. However, the number of second gate electrodes 230, separated by the upper separation regions SS, may be changed in various ways in some example embodiments. The upper gate electrodes 230U, separated by the upper separation regions SS, may constitute different string select lines. The upper separation regions SS may include an insulating material. The insulating material may include, for example, at least one of a silicon oxide, a silicon nitride, or a silicon oxynitride.

Each of the channel structures CH may include a first channel structure CH1 penetrating through the first stack structure ST1, and a second channel structure CH2 penetrating through the second stack structures ST2. The channel structures CH may each constitute or correspond to a single memory cell string, and may be disposed to be spaced apart from each other while forming rows and columns on the first region R1. The channel structures CH1 may be disposed between the main separation regions MS1 in the first region R1. The channel structures CH may be disposed between the main separation region MS1 and the first auxiliary separation regions MS2*a* and between the first auxiliary separation regions MS2*a* in the first region R1. The channel structures CH may be disposed to form a grid pattern such as a rectangular, e.g. square grid pattern, and/or may be disposed in a zigzag pattern such as a hexagonal pattern, in one direction. Each of or either of the first and second channel structures CH may have a columnar shape, and may be tapered, e.g. may have an inclined side surface narrowed in a direction toward the substrate 101 depending on an aspect ratio. Some of the channel structures CH adjacent to the second region R2, among the channel structures CH disposed in the first region R1, may be dummy channels. The channel structures CH, overlapping the upper separation regions SS, may also be dummy channels. In this case, the dummy channels may have the same (or similar) structure as the channel structures CH, but may not perform an actual function in the semiconductor device 100. The dummy channel structures CH may be floating during functioning of the semiconductor device 100; however, example embodiments are not limited thereto.

As illustrated in the enlarged view of FIG. 4, a channel layer 140 may be disposed in the channel structures CH. In the channel structures CH, the channel layer 140 may be annularly formed to surround a channel-filling insulating layer 150. However, according to some example embodiments, the channel layer 140 may have a cylindrical shape and/or a prismatic shape without the channel-filling insulating layer 150. The channel layer 140 may be connected to the first horizontal conductive layer 102 in a lower portion thereof. The channel layer 140 may include a semiconductor material such as doped or undoped polysilicon and/or doped or undoped single-crystal silicon.

Figure 15A:
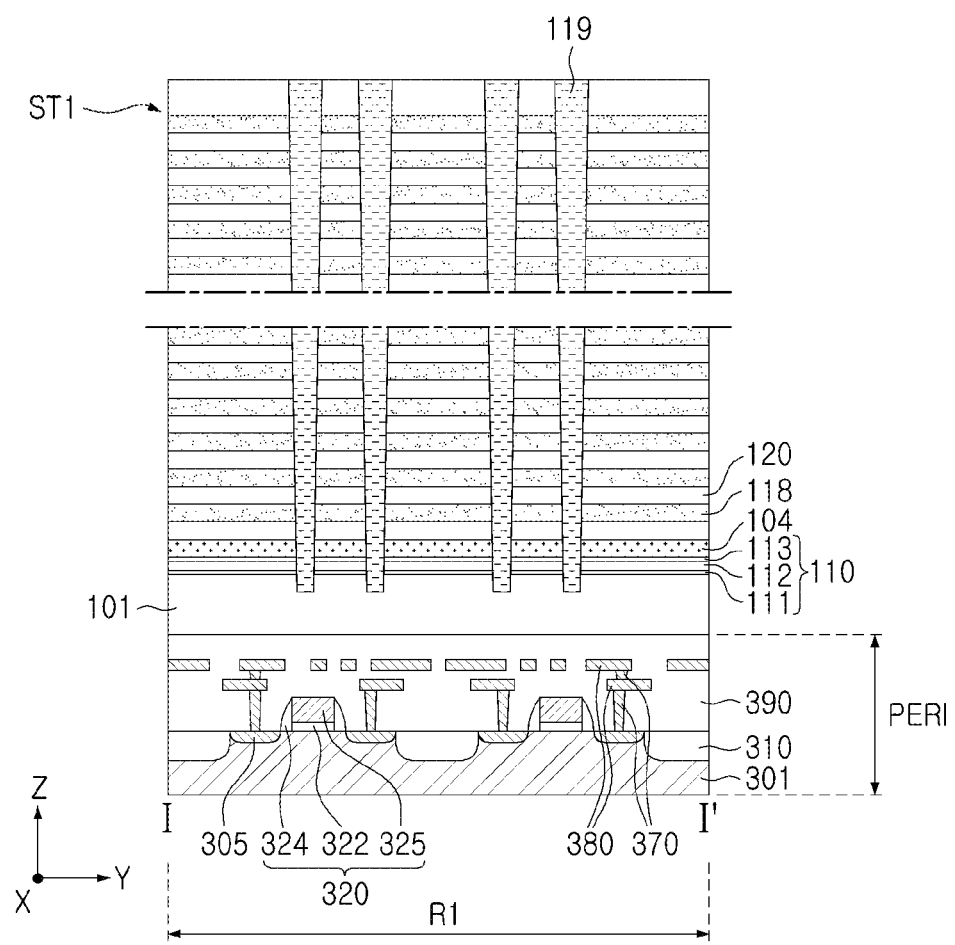
FIGS. 15A to 18C are schematic cross-sectional views illustrating a method of manufacturing/fabricating a semiconductor device according to some example embodiments.
Figure 15B:
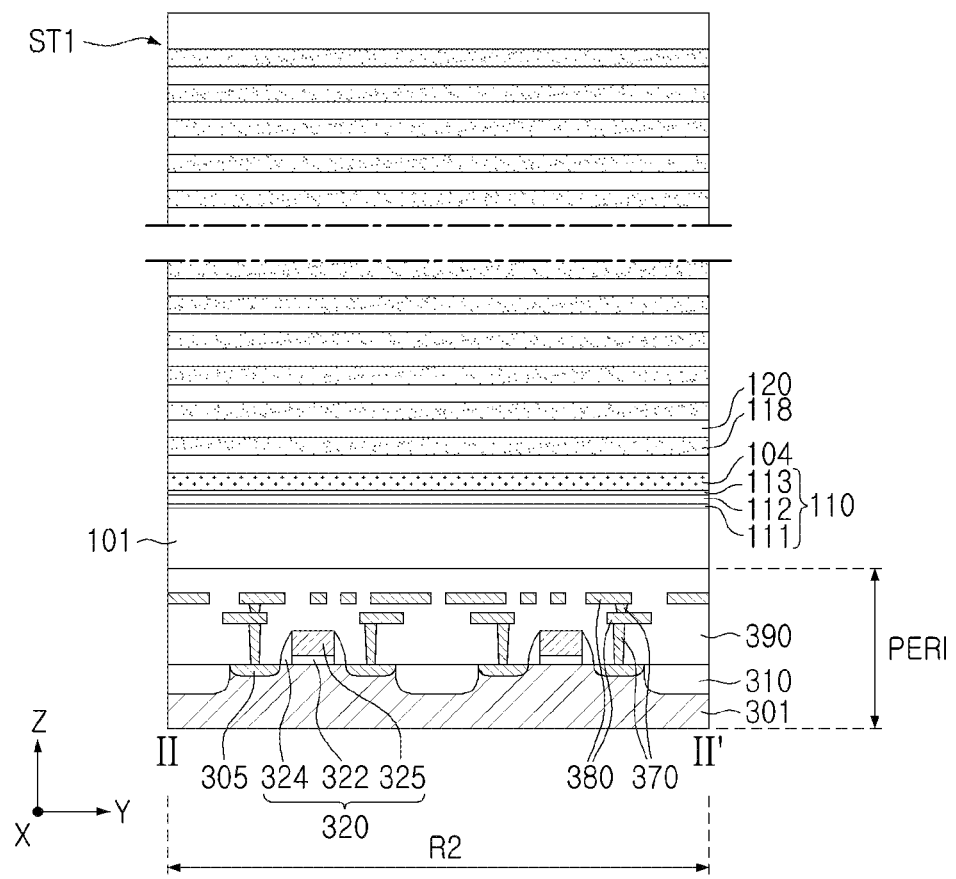
Figure 15C:
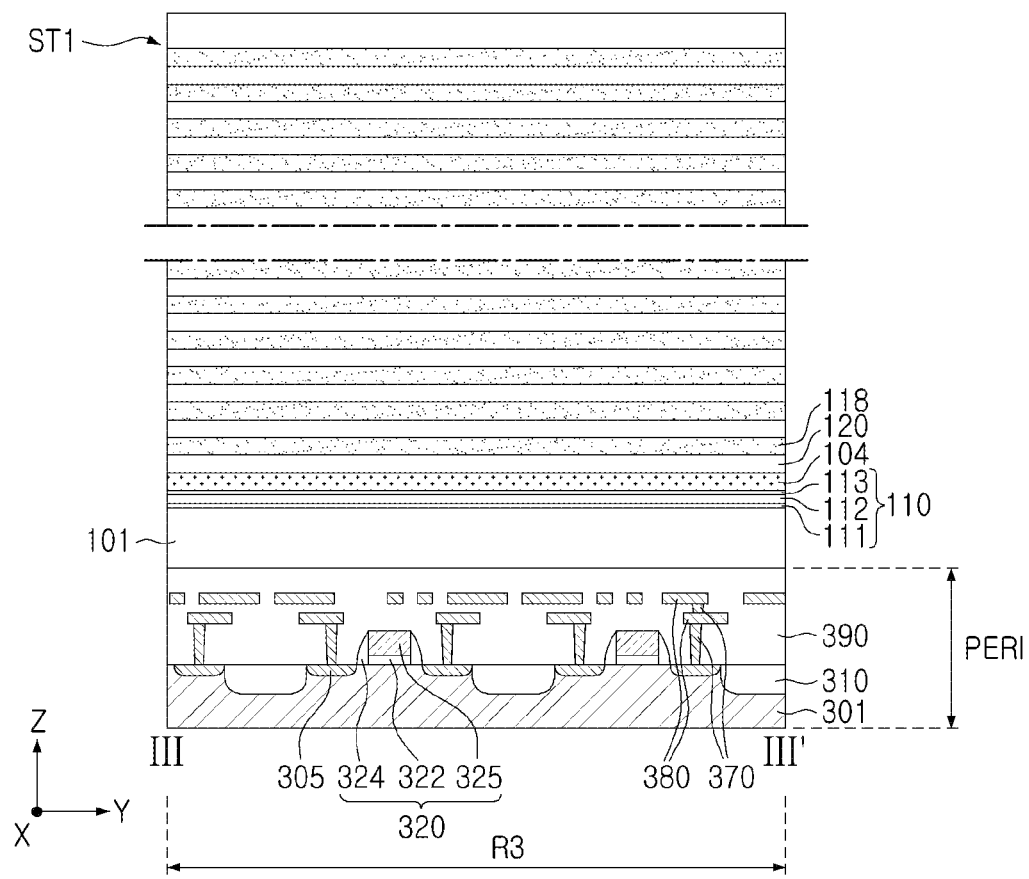

The channel structures CH may be provided in such a manner that the first channel structures CH1 disposed above and the upper second channel structures CH2 disposed below are connected to each other. In the process steps described in FIGS. 15A and 16A described below, the first and second channel structures CH1 and CH2 have channel holes formed by performing an etching process such as a dry etching process in different process steps, resulting in a difference in widths between an upper end of the first channel structure CH1 and a lower end of the second channel structure CH2. Due to the difference in widths, the channel structures CH may have bent portions or bent profiles in a region connecting the upper end of the first channel structure CH1 and the lower end of the second channel structure CH2. The channel layer 140, the gate dielectric layer 145, and the channel-filling insulating layer 150 may be in the state in which they are connected to each other between the first channel structure CH1 and the second channel structure CH2.

A channel pad 255 may be disposed on only the upper end of the second channel structure CH2 disposed above the upper end of the second channel structure CH2. However, in some example embodiments, each of the first channel structure CH1 and the second channel structure CH2 may include a channel pad 255. In this case, the channel pad 255 of the first channel structure CH1 may be connected to the channel layer 140 of the second channel structure CH2. The channel pads 255 may be disposed to cover an upper surface of the channel-filling insulating layer 150 and to be electrically connected to the channel layer 140. The channel pads 255 may include, for example, doped or undoped polysilicon.

The gate dielectric layer 145 may be disposed between the gate electrodes 130 and the channel layer 140. Although not illustrated in detail, the gate dielectric layer 145 may include a tunneling layer, a charge storage layer, and a blocking layer sequentially stacked from the channel layer 140. The tunneling layer may tunnel charge to the charge storage layer and may include, for example, silicon oxide ($SiO_2$), silicon nitride ($Si_3N_4$), silicon oxynitride (SiON), or combinations thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or combinations thereof. In some example embodiments, at least a portion of the gate dielectric layer 145 may extend in a horizontal direction along the gate electrodes 130 and 230.

In some example embodiments, the number of stack structures, stacked in a direction Z, and/or the number of channel structures may be changed in various ways.

The dummy structures DS may penetrate through the first and second stack structures ST1 and ST2. The dummy structures DS may be disposed between the main separation regions MS1 in the third region R3. The dummy structures DS may be disposed between the main separation region MS1 and the second auxiliary separation region MS2*b* and between the second auxiliary separation regions MS2*b* in the third region R3. In some example embodiments, the dummy structures DS may be disposed between the main separation region MS1 and the first auxiliary separation region MS2*a* and between the first auxiliary separation regions MS2*a* in the second region R2.

Referring to FIG. 3, a shape of the dummy structures DS may be elliptical; however, example embodiments are not limited thereto. A width of each of the dummy structures DS may be greater than a width L1 of each of the channel structures CH, as illustrated in FIG. 3. The width of each of the dummy structures DS may be defined as an average of lengths L2 and L3 of a major axis and a minor axis. In some example embodiments, each of the dummy structures DS may have a shape different from a shape of each of the channel structures CH, when viewed from above, as illustrated in FIG. 2. In some example embodiments, the width of each of the dummy structures DS may be about twice or more as great as the width L1 of each of the channel structures CH. In some example embodiments, the length L2 of the minor axis and the length L3 of the major axis of each of the dummy structures DS may be greater than the width L1 of each of the channel structures CH. In some example embodiments, the length L2 of the minor axis and the length L3 of the major axis of each of the dummy structures DS may be about twice or more as great as the width of each of the channel structures CH. The dummy structures DS may be arranged such that orientation of the minor axis and/or the major axis vary, and may not be aligned to the X direction or the Y direction. At least some of the dummy structures DS may include four dummy structures DS adjacent to one contact plug 280 from among the contact plugs 280 connected to end portions of the gate electrodes 130 and 230, in the second and third regions R2 and R3. As described above, the first auxiliary separation regions MS2*a* may be arranged at the first pitch P1, and the second auxiliary separation regions MS2*b* may be arranged at the second pitch P2 having a size different from a size of the first pitch P1. Thus, each of the dummy structures DS disposed in the third region R3 may have a relatively large size. When each of the dummy structures DS is formed to have a relatively large size, the dummy structure DS may be stably formed even when a height of each of the stack structures ST1 and ST2 is increased during an etching process of forming the dummy structures DS to be described below in FIGS. 17A to 17C.

As illustrated in FIG. 3, the distance D2 between the dummy structures DS may be greater than the distance D3 between the channel structures CH. Since the third region R3 includes a region, in which the same number of dummy structures DS may be formed, having a larger area than each of the first and second regions R1 and R2, the dummy structures DS may be stably or more stably formed in relation to the contact plugs 280 adjacent to the region R3.

Figure 17A:
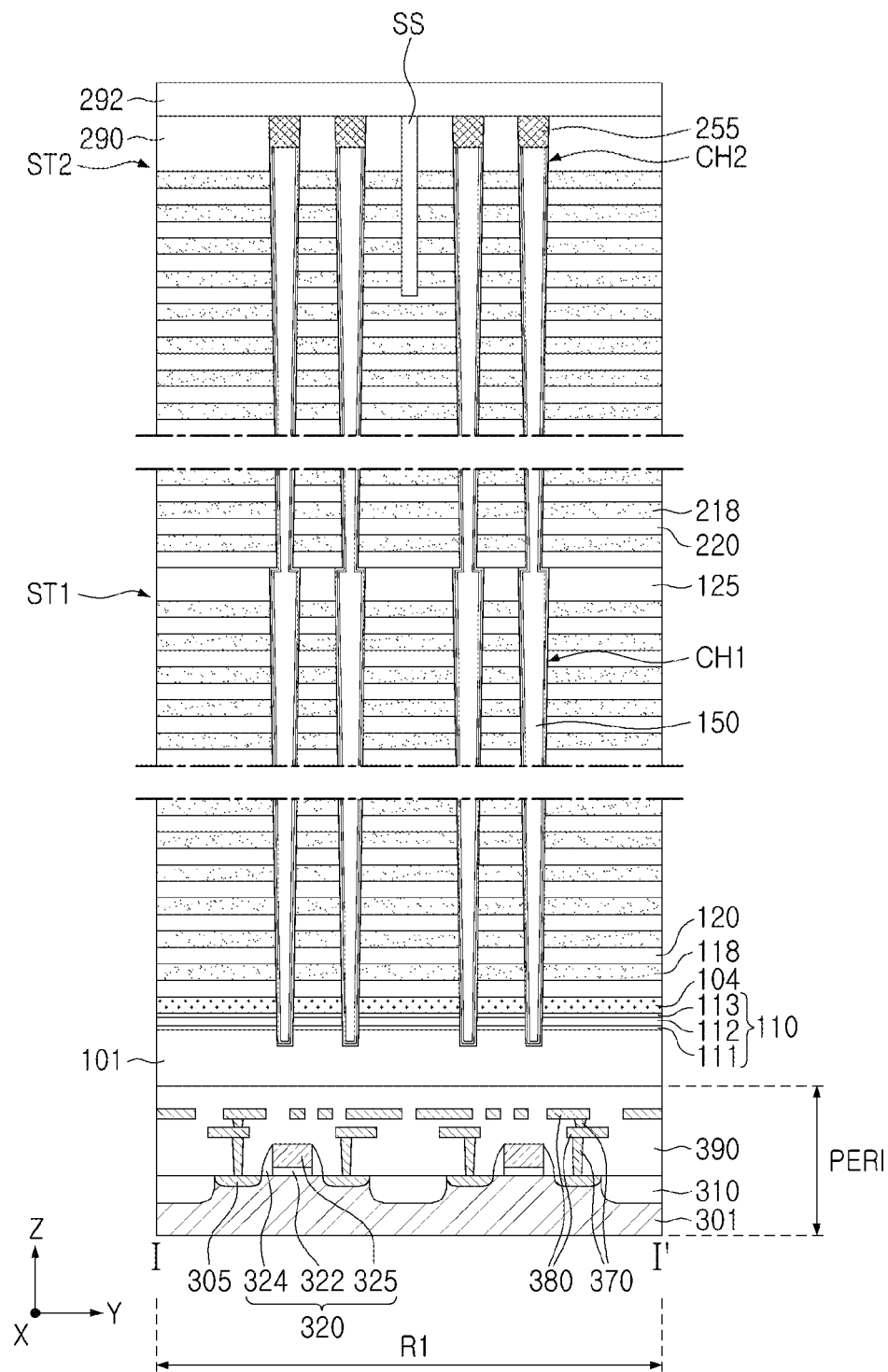
Figure 17B:
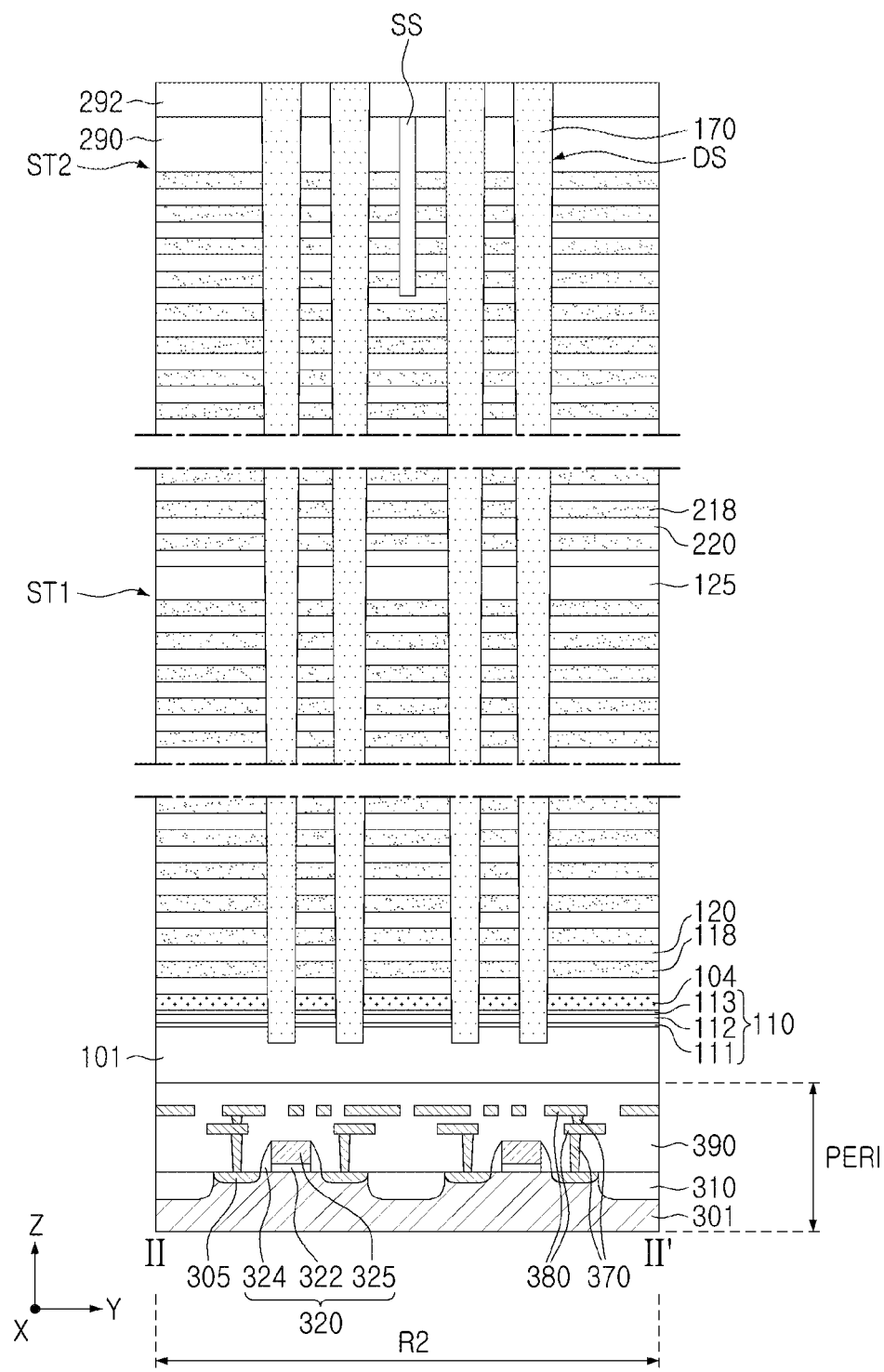
Figure 17C:
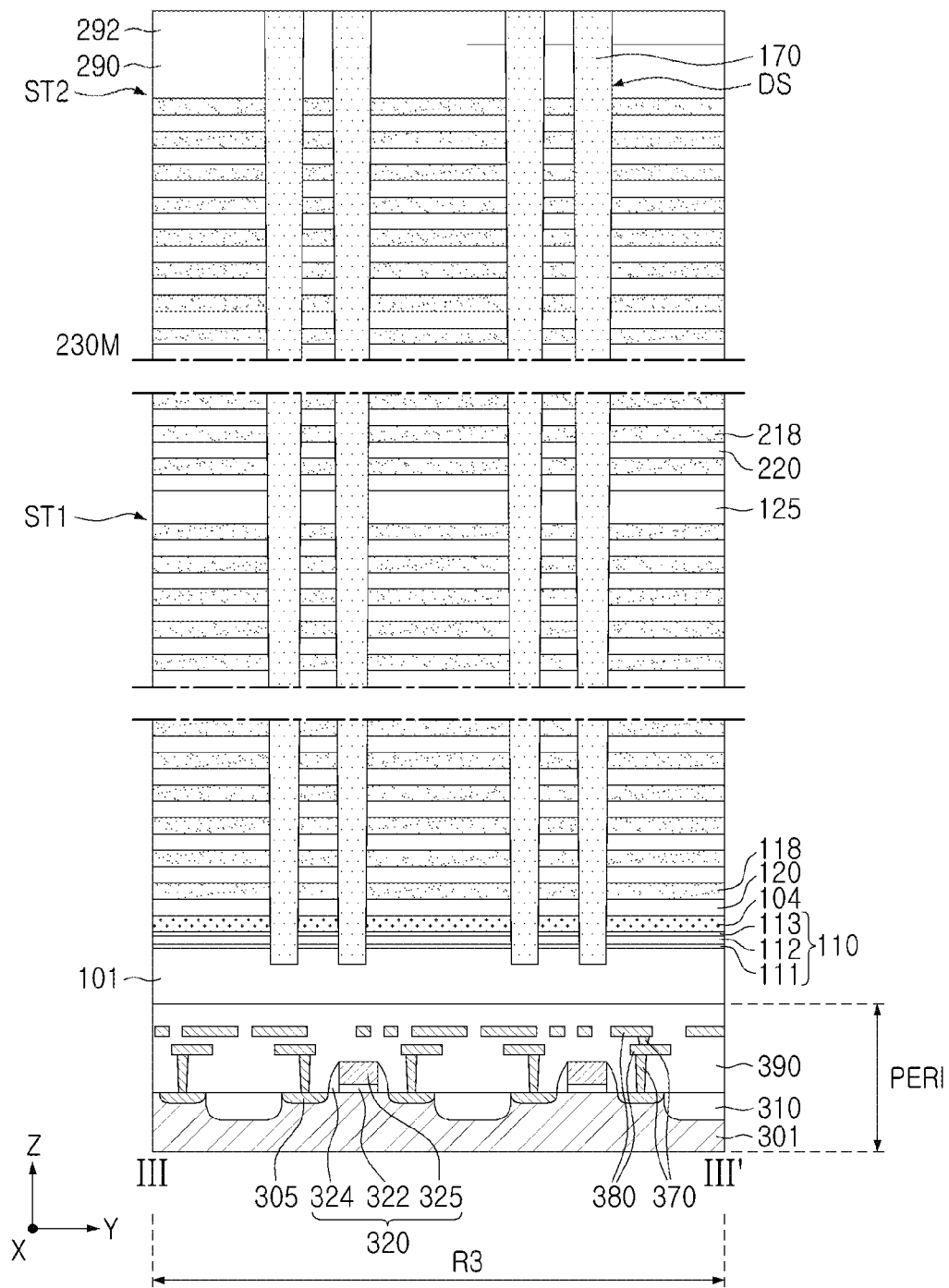

Since the dummy structures DS are formed by performing an etching process such as a dry etching process to simultaneously penetrate through the first and second stack structures ST1 and ST2 in the process steps described in FIGS. 17A to 17C, each of the dummy structures DS may have a tapered profile, e.g. a width of each of the dummy structures DS may continuously decrease from the upper portion of the second stack structure ST2 to the lower portion of the first stack structure ST1. The dummy structures DS may have a continuous width on a boundary on which the first and second stack structures ST1 and ST2 are connected to each other. For example, unlike the channel structures CH, the dummy structures DS may not include a bent portion.

The upper surfaces of the dummy structures DS may be disposed at a higher level than the upper surfaces of the channel structures CH. As illustrated in FIG. 4, the upper surface of the channel structures CH may be coplanar with the first upper insulating layer 290. As illustrated in FIG. 5, the upper surface of the dummy structures DS may be coplanar with the upper surface of the second upper insulating layer 292 disposed on the upper insulating layer 290.

The dummy structures DS may include an insulating material. The insulating material may include, for example, at least one of a silicon oxide, a silicon nitride, or a silicon oxynitride. When the dummy structures DS, instead of the channel structures CH, is disposed in the second and third regions R2 and R3 corresponding to staircase regions, electrical reliability of the contact plugs 280 connected to the staircase region may be improved because the dummy structures DS may be formed an insulating material.

The lower separation regions GS1 and GS2 may be disposed on the same level as a lowermost ground select gate electrode, among the gate electrodes 130 and 230. The lower separation regions GS1 and GS2 may penetrate through at least one first gate electrode 130 including a lowermost gate electrode, among the first gate electrodes 130, between the main separation regions MS1.

The lower separation region GS1 may be disposed to connect the first auxiliary separation region MS2a and the second auxiliary separation region MS2b, adjacent to each other, on a boundary between the second region R2 and the third region R3 or in a region adjacent to the boundary. Accordingly, the ground select gate electrodes may be connected between some of the first and second auxiliary separation regions MS2a and MS2b, but may be divided into three sub-gate electrodes by the lower separation regions GS1 on the boundary between the second region R2 and the third region R3. Each of the first lower separation regions GS1 may include a first portion GS1a disposed in a direction horizontal to the first auxiliary separation region MS2a, and a second portion GS1b disposed in a direction perpendicular to the second auxiliary separation region MS2b. The first portion GS1a and the second portion GS1b of the first lower separation regions GS1 may be disposed perpendicular to each other and may extend in different directions. In some example embodiments, two first lower separation regions GS1 disposed between the main separation regions MS1 may be symmetrical around an extension line of the upper separation region SS, disposed in the center thereof, in the direction Y. In some example embodiments, the two first lower separation regions GS1 may be symmetrical with respect to a center between a pair of main separation regions MS1 in the direction Y. In some example embodiments, the second portion GS1b of the first lower separation regions GS1 may be positioned toward an adjacent main separation region MS1, of the pair of main separation regions MS1, and to be perpendicular to the first portion GS1a.

In the third region R3, the second lower separation region GS2 may be disposed adjacent to a region in which the second auxiliary separation regions MS2b are spaced apart from each other in the direction X. Unlike the first lower separation region GS1, the second lower separation region GS2 may have only a portion disposed in a direction, horizontal to the second auxiliary separation regions MS2b, when viewed in plan view, e.g. from above.

The lower separation regions GS1 and GS2 may be formed of, for example, a silicon oxide, and may include the same material as the interlayer insulating layer 120. In some example embodiments, the number and/or arrangement of the lower separation regions GS1 and GS2 are not limited to what is illustrated in FIG. 1 and may be changed in various ways.

A first upper insulating layer 290, a second upper insulating layer 292, and a third upper insulating layer 294 may be sequentially stacked on the second stack structure ST2. The first upper insulating layer 290 may be disposed to cover the substrate 101, and the gate electrodes 130 and the peripheral insulating layer 390 on the substrate 101. The first to third upper insulating layers 290, 292, and 294 may be formed of an insulating material, and may be formed to have the same, or alternatively a different, thickness and/or material composition from each other. In some example embodiments, each of the first to third upper insulating layers 290, 292, and 294 may include a plurality of insulating layer.

In the first region R1, the channel contact plugs 270 may penetrate through the second and third upper insulating layers 292 and 294 and may be electrically connected to the channel structures CH. A bitline 275 may be disposed on the channel contact plugs 270 to be electrically connected to the channel contact plugs 270. Each of the channel contact plugs 270 and the bitline 275 may include a conductive material, for example, at least one of tungsten (W), copper (Cu), aluminum (Al), or the like, and may each further include a diffusion barrier layer.

The contact plugs 280 may be vertically formed in the direction Z to have a cylindrical shape, and may be electrically connected to the first and second gate electrodes 130 and 230. The contact plugs 280 may include a conductive material, for example, at least one of tungsten (W), copper (Cu), aluminum (Al), and the like, and may each further include a diffusion barrier layer.

In FIGS. 8 to 14, the same components as those illustrated in FIGS. 1 to 7 are designated by the same reference numerals, and description thereof will be omitted.

Figure 8:
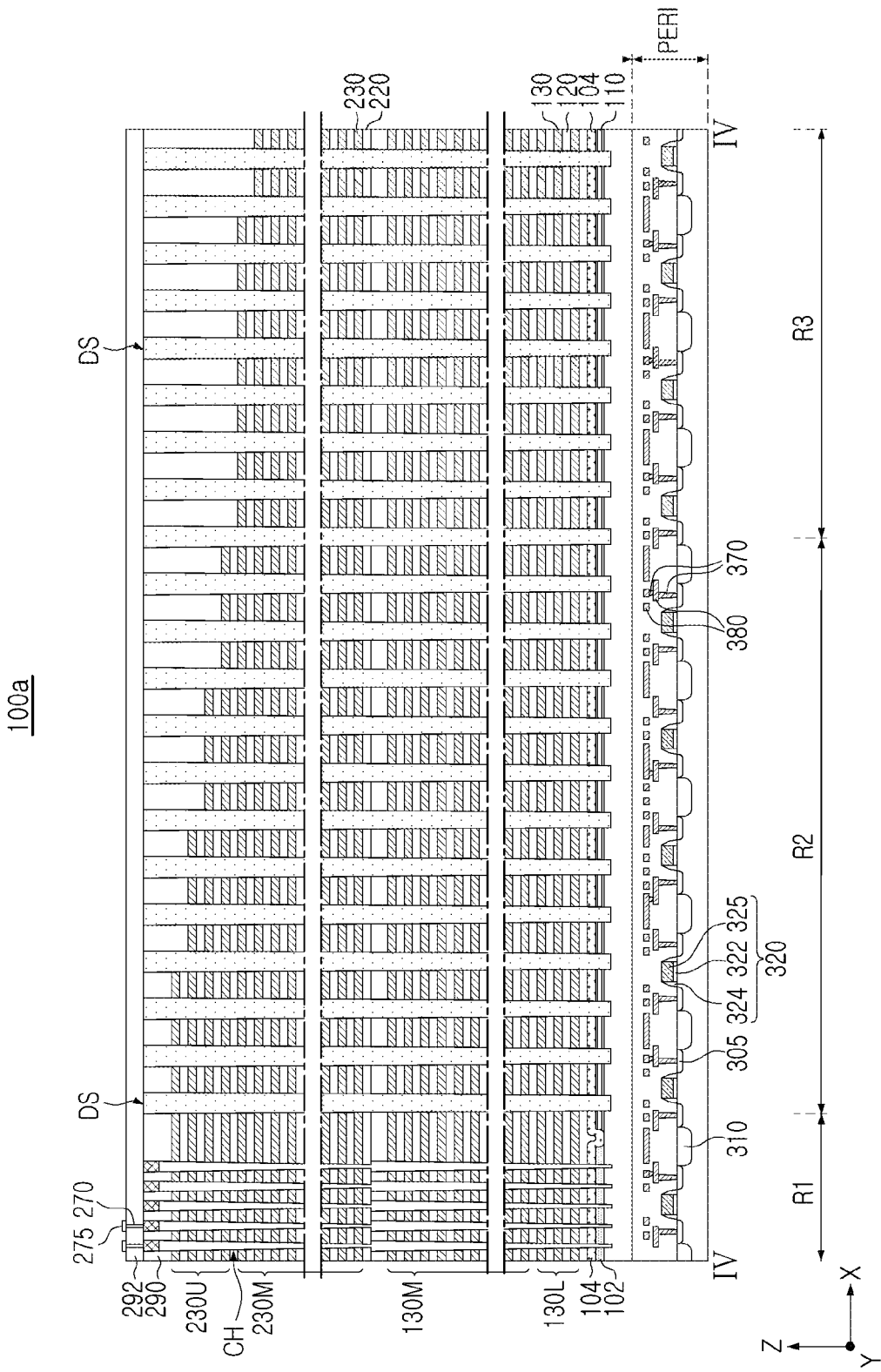
FIG. 8 is a schematic cross-sectional view of a semiconductor device according to some example embodiments.

FIG. 8 is a schematic cross-sectional view of a semiconductor device according to some example embodiments.

Figure 16A:
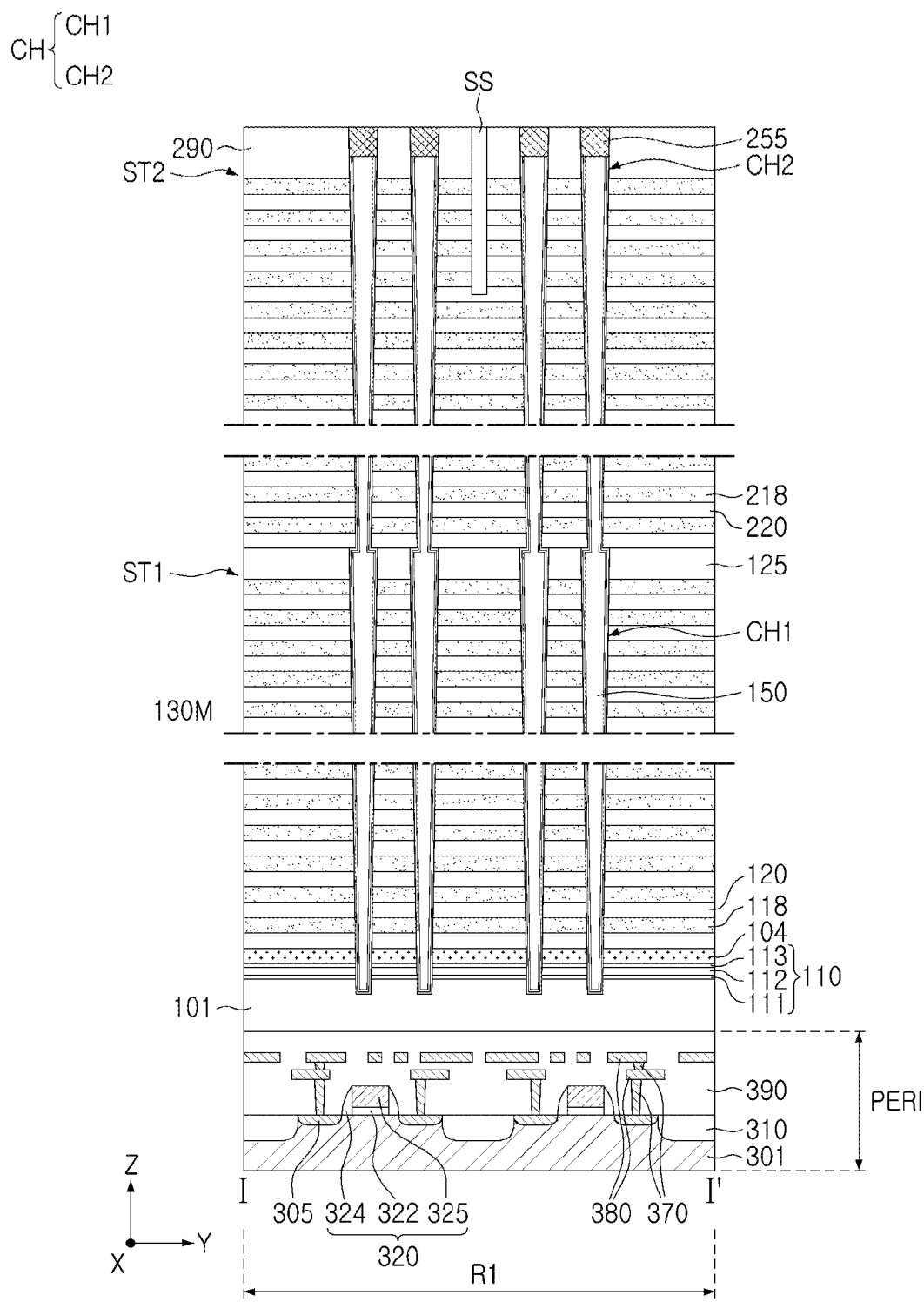
Figure 16B:
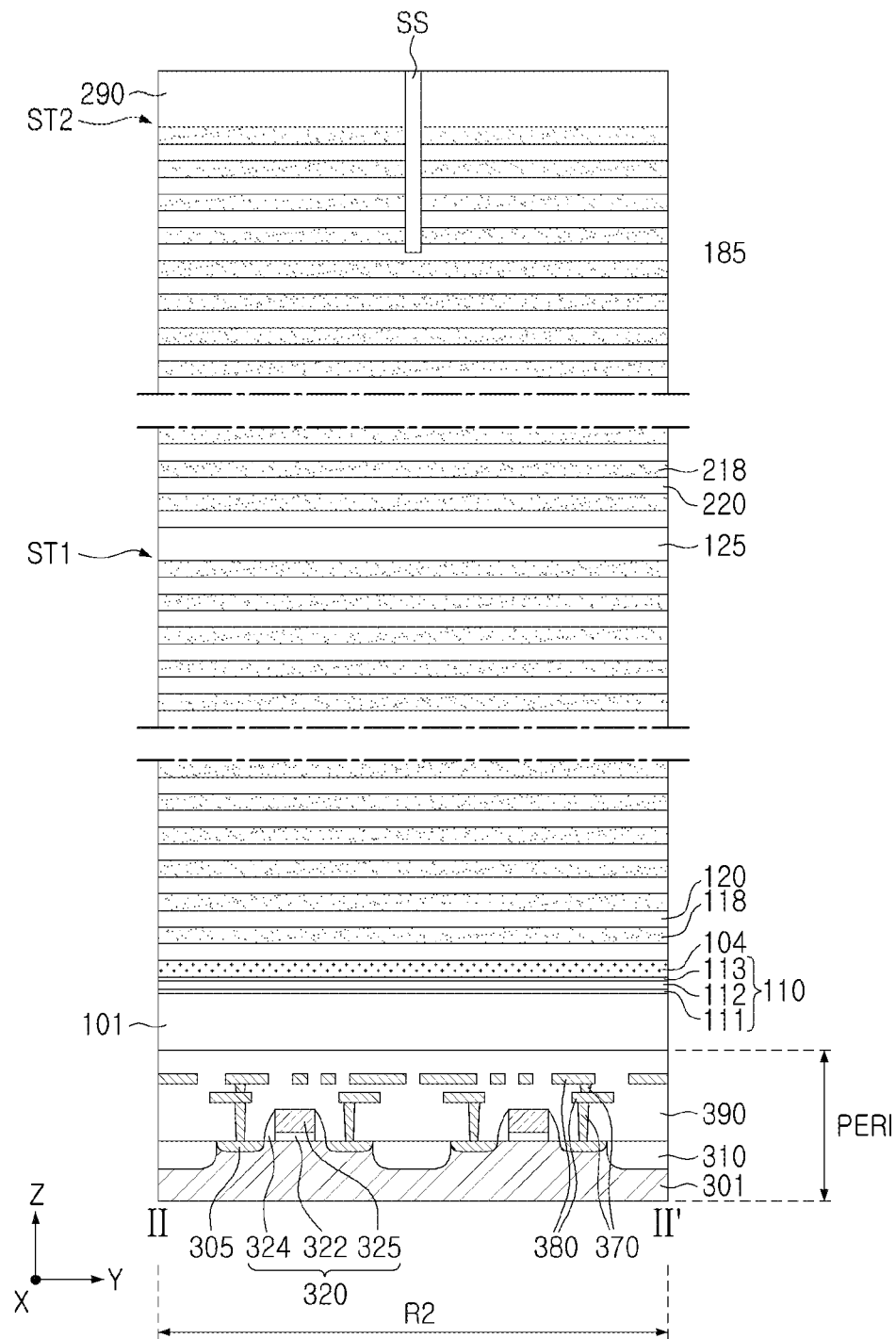
Figure 16C:
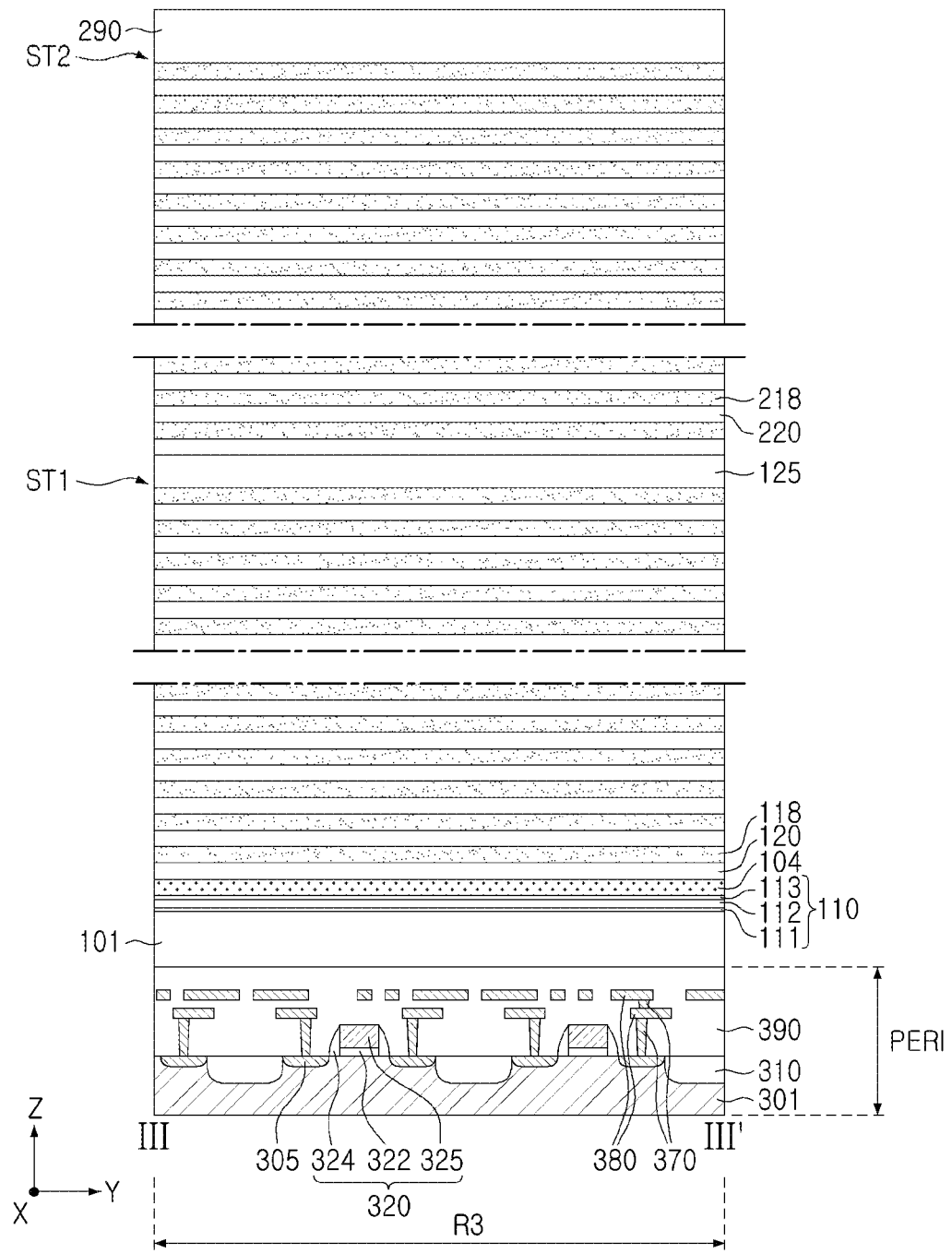

Referring to FIG. 8, in a semiconductor device 100a, upper surfaces of channel structures CH may have substantially the same level as upper surfaces of dummy structures DS. The upper surfaces of the channel structures CH, the upper surfaces of the dummy structures DS, and an upper surface of a first upper insulating layer 290 may be coplanar with each other. The dummy structure DS may be formed at the same as a channel structure CH of FIGS. 16A to 16C is formed, as opposed to an etching process of the dummy structures DS being performed after the channel structures CH are formed, similarly to the process step of forming the dummy structures DS described in FIGS. 17A to 17C. For example, in the process step of performing the etching process of the second channel structure CH2 among the channel structures CH, the etching process of the dummy structures DS may be simultaneously performed.

Figure 9:
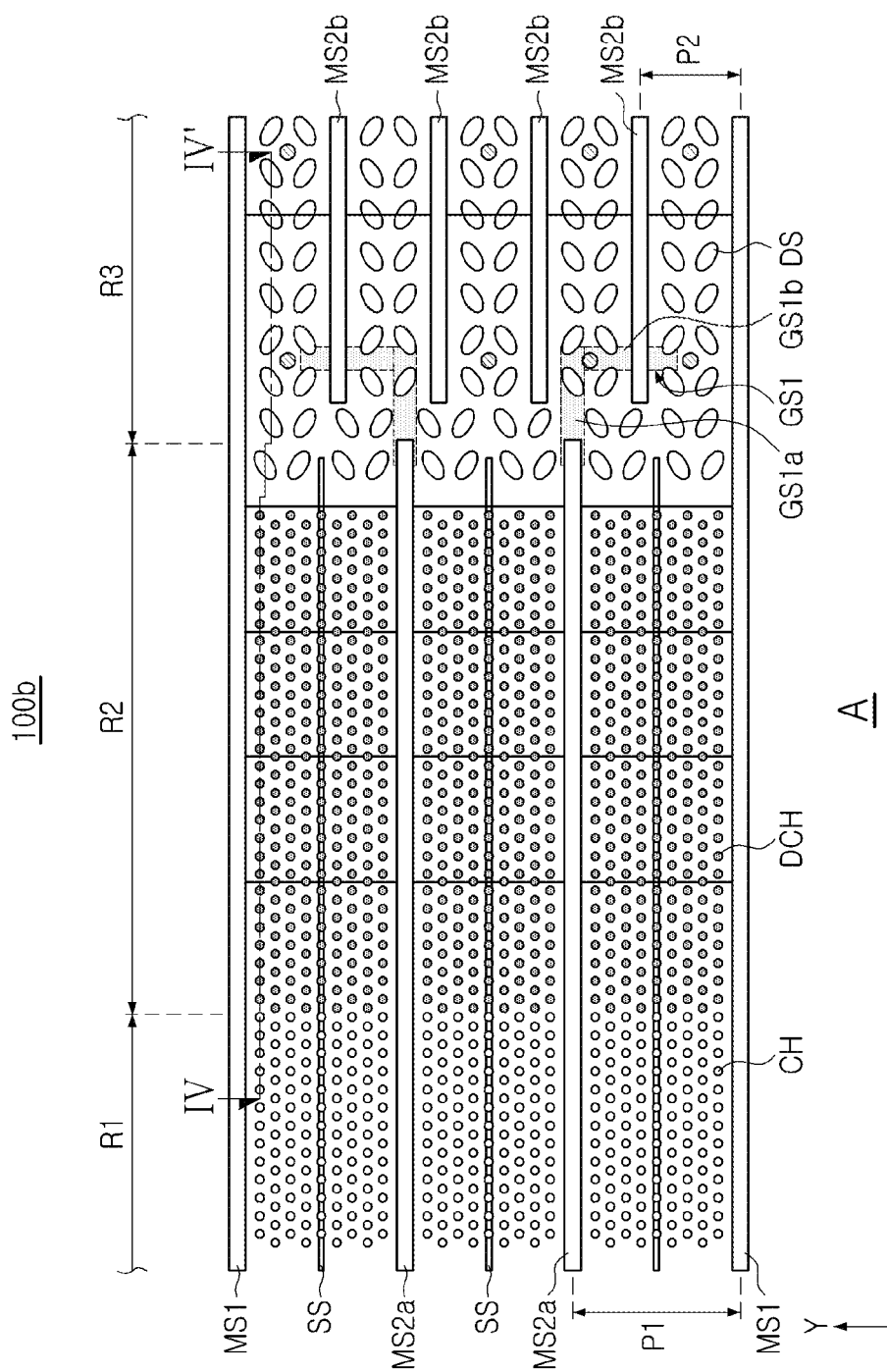
FIG. 9 is a schematic plan view of a semiconductor device according to some example embodiments.

FIG. 9 is a schematic plan view of a semiconductor device according to some example embodiments. FIG. 9 illustrates a region corresponding to the region "A" of FIG. 1.

Figure 10:
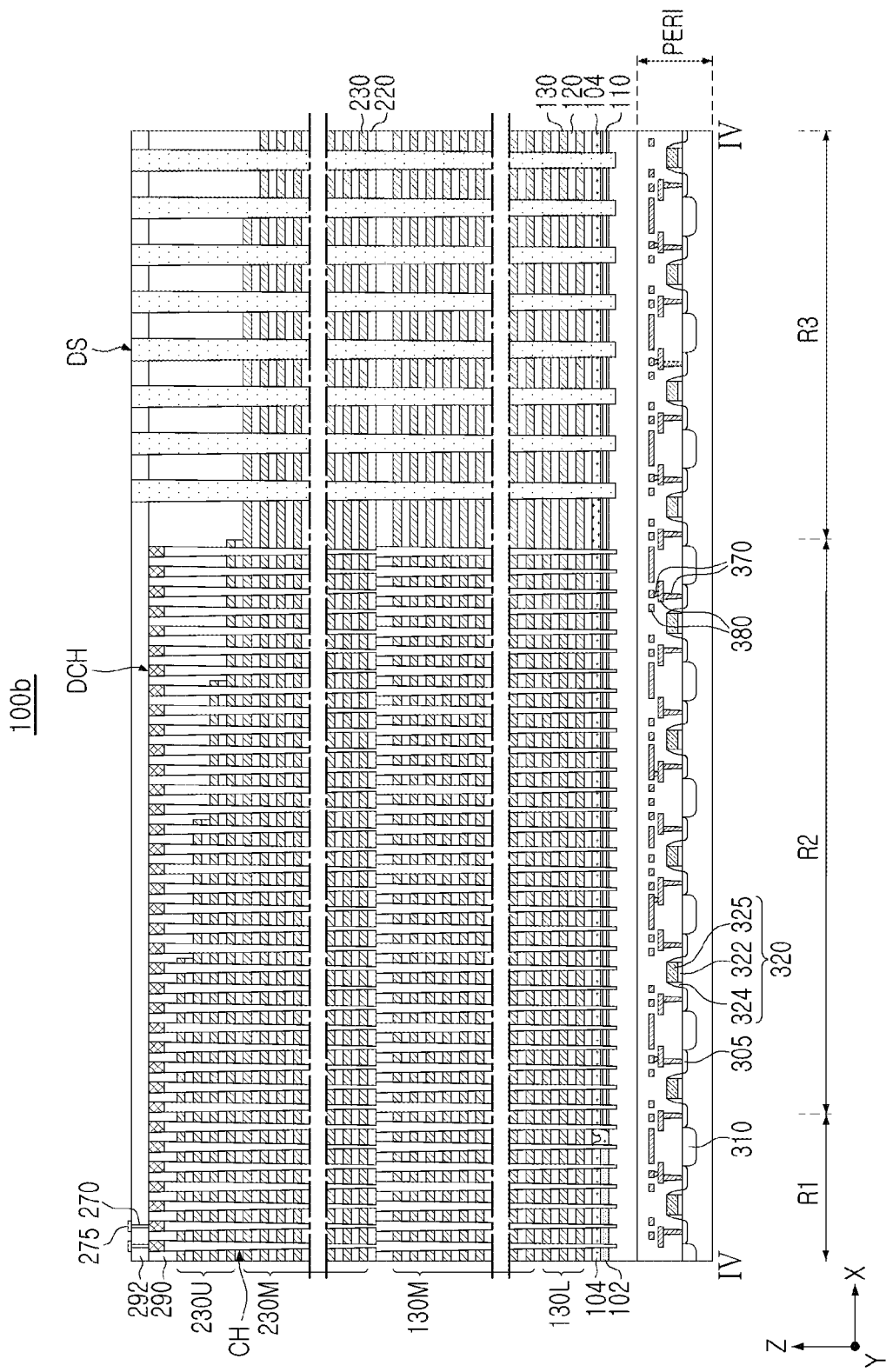
FIG. 10 is a schematic cross-sectional view of a semiconductor device according to some example embodiments.

FIG. 10 is a schematic cross-sectional view of a semiconductor device according to some example embodiments.

Referring to FIGS. 9 and 10, in a semiconductor device 100b, dummy structures DS may be disposed only between a main separation region MS1 and a second auxiliary separation region MS2b and between second auxiliary separation regions MS2b in a third region R3. The dummy structures DS may be disposed in a third region R3 having a larger area than the second region, and dummy channel structures DCH may be disposed in a second region R2. The dummy structures DS may be disposed between the main separation region MS1 and the second auxiliary separation region MS2b and between the second auxiliary separation regions MS2b, and the dummy channel structures DCH may be disposed between the main separation region MS1 and the first auxiliary separation region MS2a of the second region R2 and between first auxiliary separation regions MS2a of the second region R2. Alternatively or additionally, the channel structures CH may be disposed between the main separation region MS1 and the first auxiliary separation region MS2a of a first region R1 and between the first auxiliary separation regions MS2a of the first region R1. The dummy channel structures DCH may have the same (or similar) structure as the channel structures CH, but may not perform an actual function in the semiconductor device 100b, and/or may be floating during operation of the semiconductor device 100b. In some example embodiments, some of the channel structures CH, adjacent to the second region R2, may be dummy channel structures DCH. The dummy channel structures DCH may not be electrically connected to each other by a channel contact plug 270 and a bitline 275. A contact plugs 280 of the second region R2 may be disposed on the other ends of the gate electrodes 130 and 230 in a region, not illustrated.

Figure 11:
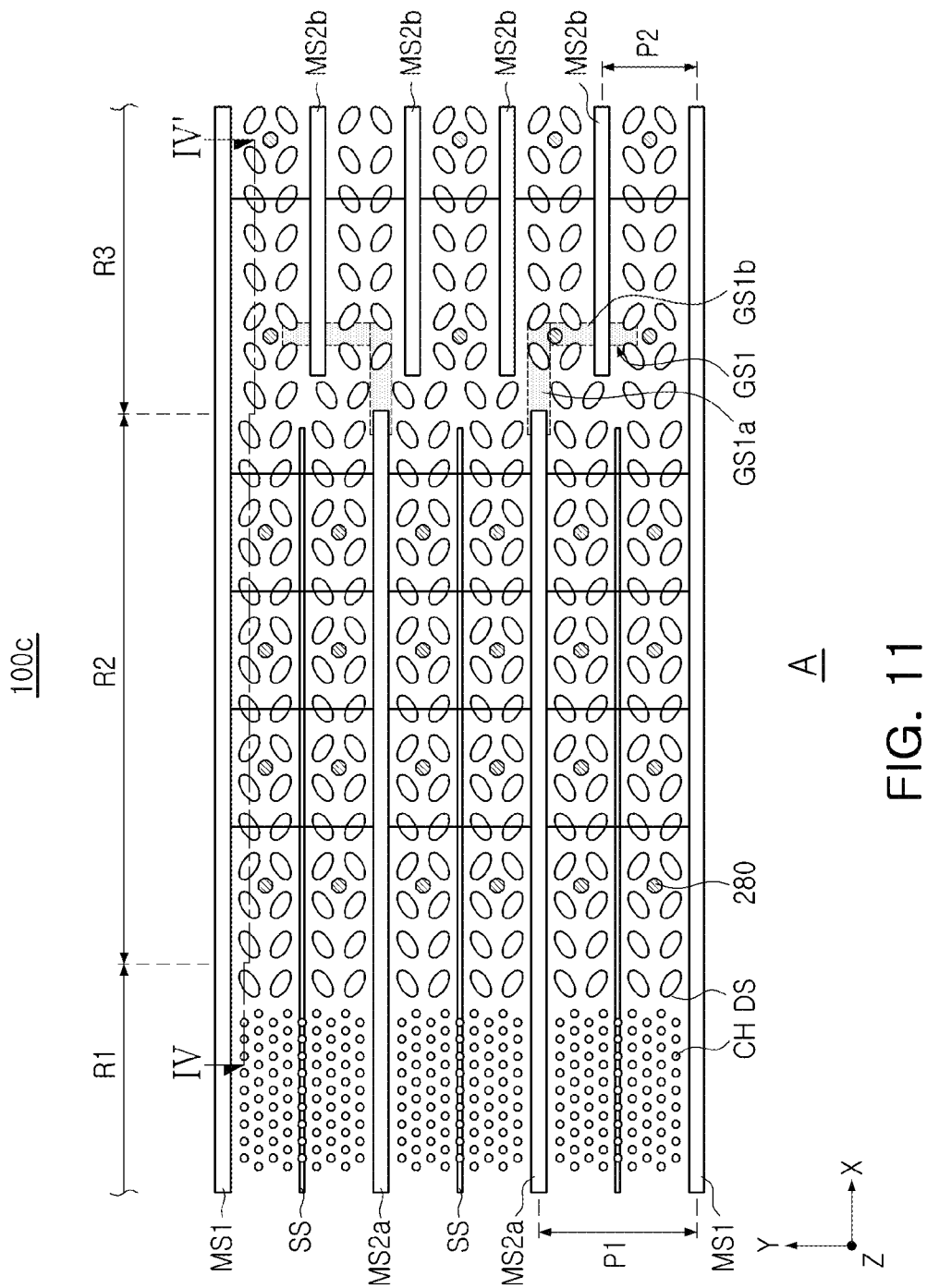
FIG. 11 is a schematic plan view of a semiconductor device according to some example embodiments.

FIG. 11 is a schematic plan view of a semiconductor device according to some example embodiments. FIG. 11 illustrates a region corresponding to the region "A" of FIG. 1.

Figure 12:
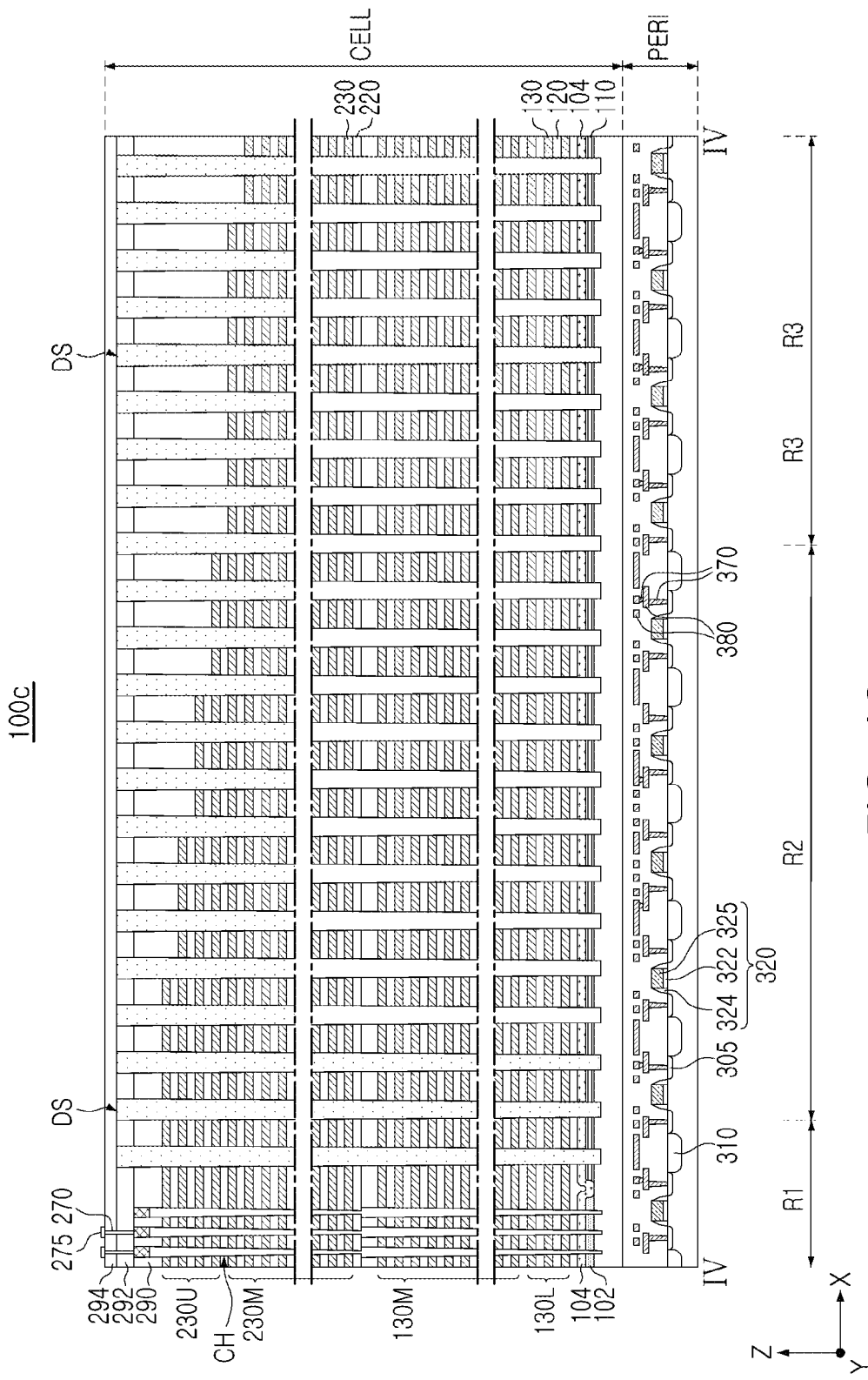
FIG. 12 is a schematic cross-sectional view of a semiconductor device according to some example embodiments.

FIG. 12 is a schematic cross-sectional view of a semiconductor device according to some example embodiments.

Referring to FIGS. 11 and 12, in a semiconductor device 100c, dummy structures DS may be disposed an entire staircase region in which end portions of gate electrodes 130 and 230 are formed, and at least a portion of a region in which memory cells are disposed. The dummy structures DS may be disposed in a second region R2 and a third regions R3, channel structures CH may be disposed in a first region R1, and dummy structures DS may be disposed in at least a portion of the first region R1 adjacent to the second region R2. The dummy structures DS may be disposed in at least a portion of the first region R1 in which contact plugs 280 are not disposed, in addition to the second and third regions R2 and R3 in which the contact plugs 280 are disposed. In the first region R1, the channel structures CH may be disposed between a main separation region MS1 and a first auxiliary separation region MS2a and between the first auxiliary separation regions MS2a. The dummy structures DS may be disposed in a portion of the first region R1 adjacent to the second region R2, between the main separation MS1 and the first auxiliary separation region MS2a in the second region R2, and between second auxiliary separation regions MS2b in the third region R2.

Figure 13:
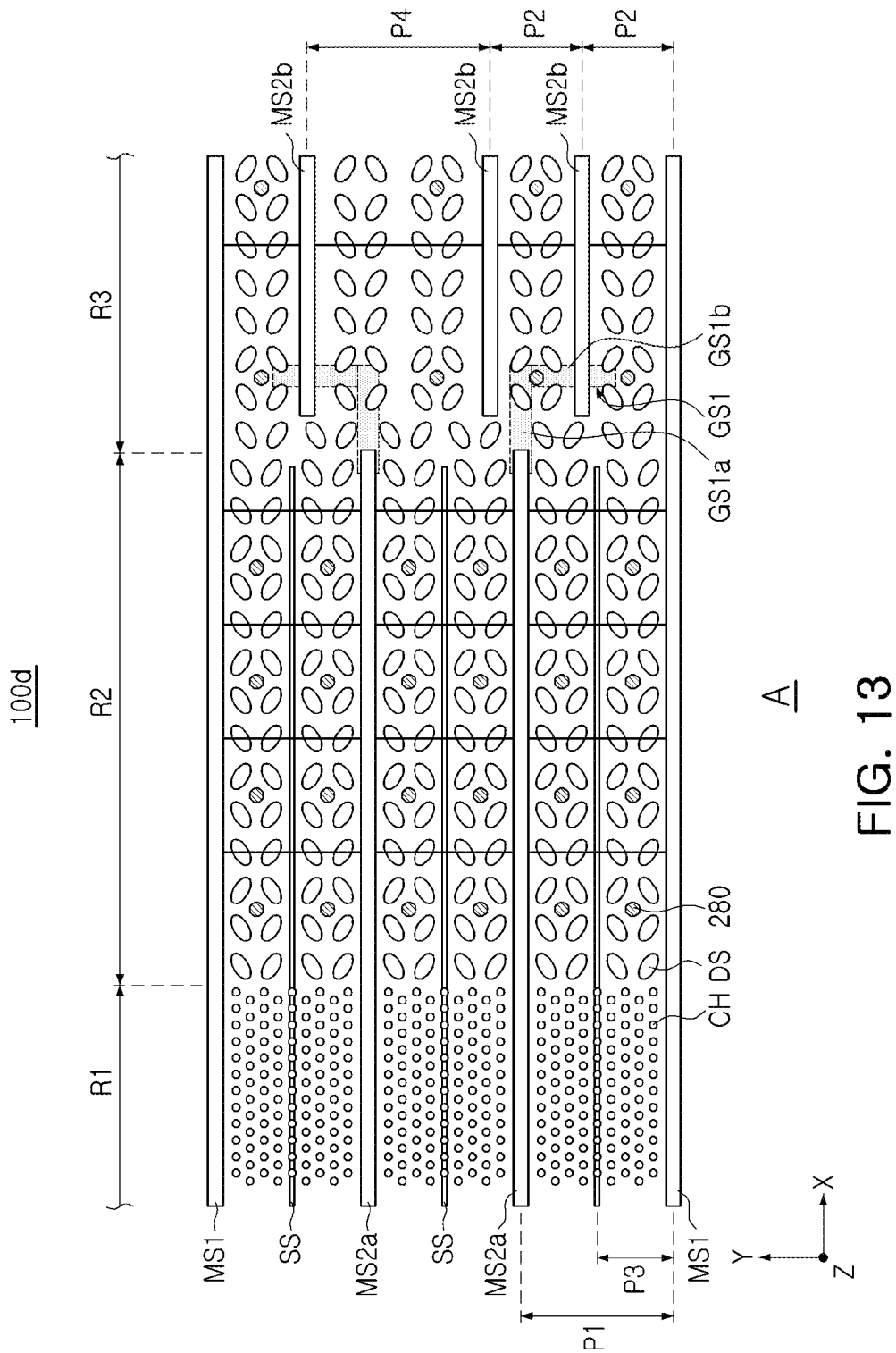
FIG. 13 is a schematic plan view of a semiconductor device according to some example embodiments.

FIG. 13 is a schematic plan view of a semiconductor device according to some example embodiments.

Referring to FIG. 13, in a semiconductor device 100d, second auxiliary separation regions MS2b may be arranged at two or more different pitches. The second auxiliary separation regions MS2b may be arranged at, for example, a second pitches P2 and a fourth pitch P4 different from each other. The second auxiliary separation regions MS2b may be asymmetrically arranged between a pair of main separation regions MS1. In some example embodiments, at least one of the second pitch P2 and the fourth pitch P4 may be different from a first pitch P1. In some example embodiments, the fourth pitch P4 may be twice the second pitch P2; however, example embodiments are not limited thereto. In some example embodiments, distances P2 and P4 between centers of the second auxiliary separation regions MS2b may each be greater than a distance P3 from a center of the main separation region MS1 to a center of an upper separation region SS and a distance from the center of the upper separation region SS to a center of a first auxiliary separation region MS2a.

Figure 14:
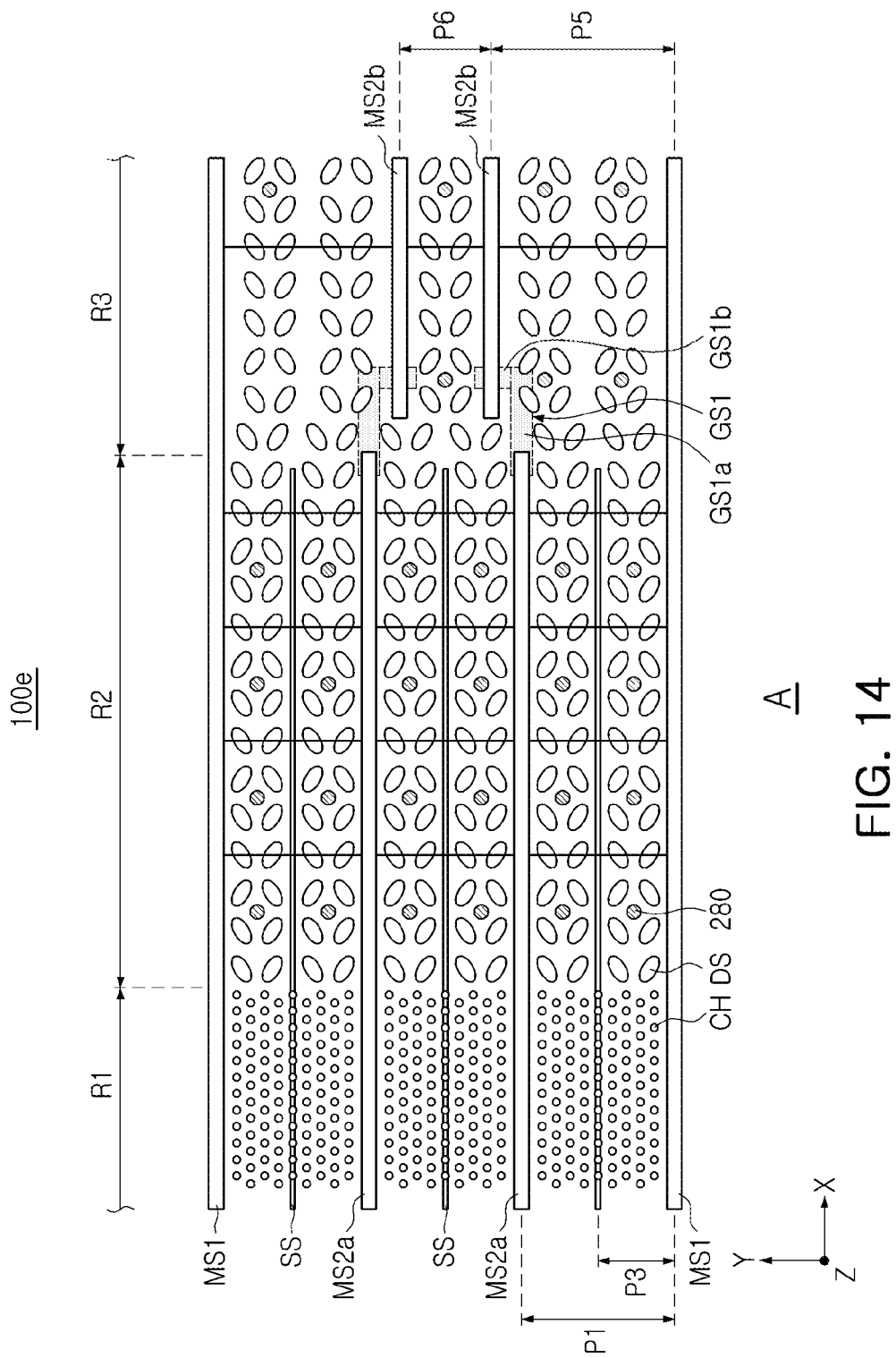
FIG. 14 is a schematic plan view of a semiconductor device according to some example embodiments.

FIG. 14 is a schematic plan view of a semiconductor device according to some example embodiments.

Referring to FIG. 14, in a semiconductor device 100e, second auxiliary separation regions MS2b may be arranged at two or more different pitches. The second auxiliary separation regions MS2b may be arranged at, for example, a fifth pitch P5 and a sixth pitch P6. The second auxiliary separation regions MS2b may be symmetrically arranged between a pair of main separation regions MS1. In some example embodiments, at least one of the fifth pitch P5 and the sixth pitch P6 may be different from a first pitch P1. In some example embodiments, the fifth pitch P5 may be twice the sixth pitch P6; however, example embodiments are not limited thereto. In some example embodiments, distances P5 and P6 between centers of the second auxiliary separation regions MS2b may each be greater than a distance P3 from a center of the main separation region MS1 to a center of an upper separation region SS and a distance from the center of the separation region SS to a center of a first auxiliary separation region MS2a.

A second portion GS1b of first lower separation regions GS1 may be disposed to be perpendicular to a first portion GS1a of the first lower separation regions GS1 and to oppose an adjacent one of a pair of main separation regions MS1. In some example embodiments, two first lower separation regions GS1, disposed between the pair of main separation regions MS1, may be asymmetrically with respect to a center of the pair of main separation regions MS1. In some example embodiments, the two first lower separation regions GS1, disposed between the pair of main separation regions MS1, may be alternately disposed in a direction Y. In some example embodiments, the two first lower separation regions GS1, disposed between the pair of main separation regions MS1, may have first portions GS1a having different lengths.

FIGS. 15A to 18C are schematic cross-sectional views illustrating a method of manufacturing/fabricating a semiconductor device according to some example embodiments. Each of FIGS. 15A, 16A, 17A, and 18A illustrates a manufacturing method in a cross section taken along line I-I' of FIG. 2, each of FIGS. 15B, 16B, 17B, and 18B illustrate a manufacturing/fabricating method in a cross section taken along line II-IT of FIG. 2, each of FIGS. 15c, 16c, 17c, and 18c each illustrate a manufacturing/fabricating method in a cross section taken along line III-III' of FIG. 2.

Referring to 15A to 15C, a peripheral circuit structure PERI including circuit elements 320 and lower interconnection structures may be formed on a base substrate 301, and a substrate 101 provided with a memory cell structure CELL, a horizontal insulating layer 110, and a second horizontal conductive layer 104 may be formed on the peripheral circuit structure, and then first sacrificial insulating layers 118 and first interlayer insulating layers 120 may be alternately stacked to form a first stack structure ST1. A portion of the first stack structure ST1 of the first sacrificial insulating layers 118 and the first interlayer insulating layers 120 may be removed, and then through-sacrificial layers 119 may be formed.

Device isolation layers 310 may be formed in the base substrate 301, and a circuit gate dielectric layer 322 and a circuit gate electrode 325 may be sequentially formed on the base substrate 301. The device isolation layers 310 may be formed by, for example, a shallow trench isolation (STI) process and may be formed with a deposition process such as a high-density plasma (HDP) deposition process and/or a spin-on glass (SOG) process. The circuit gate dielectric layer 322 and the circuit gate electrode 325 may be formed using atomic layer deposition (ALD) and/or chemical vapor deposition (CVD). The circuit gate dielectric layer 322 may be formed of a silicon oxide, and the circuit gate electrode 325 may be formed of at least one of doped or undoped polysilicon and a metal silicide, but example embodiments are not limited thereto. A spacer layer 324 and source/drain regions 305 may be formed on both sidewalls of the circuit gate dielectric layer 322 and the circuit gate electrode 325. According to embodiments, the spacer layer 324 may include a plurality of layers. Then, a doping process such as a beamline ion implantation process and/or a plasma-assisted doping (PLAD) process may be performed to form source/drain regions 305.

Among the lower interconnection structures, circuit contact plugs 370 may be formed by forming a portion of a peripheral insulating layer 390, etching the portion to be removed, and filling the removed portion with a conductive material. Circuit interconnection lines 380 may be formed by, for example, depositing a conductive material and patterning the deposited conductive material. The deposition of conductive material may be performed using at least one of a CVD process, a physical vapor deposition (PVD) process, or an electrochemical deposition process.

The peripheral insulating layer 390 may include a plurality of insulating layers. In respective process steps of forming lower interconnection structures, a portion of the peripheral insulating layer 390 may be formed and another portion thereof may be formed on the uppermost circuit interconnection line 380. Thus, the peripheral insulating layer 390 may be ultimately formed to cover the circuit elements 320 and the lower interconnection structures.

Then, the substrate 101 may be formed on the peripheral insulating layer 390. The substrate 101 may be formed of, for example, polysilicon, and may be formed by a CVD process. The polysilicon, forming the substrate 101, may include impurities such as at least one of boron, phosphorus, arsenic, or carbon.

First to third horizontal insulating layers 111, 112, and 113, constituting the horizontal insulating layer 110, may be sequentially stacked on the substrate 101. The horizontal insulating layer 110 may be or include layers, some of which are replaced with the first horizontal conductive layer 102 of FIG. 4 in a subsequent process. The first and third horizontal insulating layers 111 and 113 may include or consist of a material different from a material of the second horizontal insulating layer 112. For example, the first and third horizontal insulating layers 111 and 113 may be formed of the same material as the interlayer insulating layers 120, and the second horizontal insulating layer 112 may be formed of the same material as the first sacrificial insulating layers 118. The horizontal insulating layer 110 may be removed in some regions by a patterning process.

The second horizontal conductive layer 104 may be formed on the horizontal insulating layer 110, and may be in contact with a second substrate 101 in a region in which the horizontal insulating layer 110 is removed. Accordingly, the second horizontal conductive layer 104 may be bent along end portions of the horizontal insulating layer 110 and may extend upwardly of the second substrate 101 while covering the end portions.

First sacrificial insulating layers 118 may be layers, some of which are replaced with the first gate electrodes (see FIGS. 4 to 6) in a subsequent process. The first sacrificial insulating layers 118 may include or consist of a material different from a material of the first interlayer insulating layers 120, and may be formed of a material having an etch selectivity with respect to the interlayer insulating layers 120 under a specific etching condition. For example, the first interlayer insulating layer 120 may be formed of or consist of at least one of a silicon oxide and a silicon nitride, and the first sacrificial insulating layers 118 may be formed of a material, different from a material of the first interlayer insulating layer 120, selected from the group including or consisting of silicon, a silicon oxide, a silicon carbide, and a silicon nitride. In some example embodiments, the first interlayer insulating layers 120. The thicknesses and number of the first interlayer insulating layers 120 and the first sacrificial insulating layers 118 may be changed in various ways from what is illustrated.

Through-sacrificial layers 119 may be formed to penetrate through a first stack structure ST1 in locations, respectively corresponding to the first channel structures CH1 of FIG. 4, in the first region R1 of the substrate 101. First, through-holes corresponding to the first channel structures CH1 may be formed. Due to a height of the first stack structure ST1, the through-holes may be tapered, e.g. sidewalls of the through-holes may not be perpendicular to an upper surface of the substrate 101. In some example embodiments, the through-holes may be formed to recess a portion of the substrate 101. The through-sacrificial layers 119 may be formed by filling the through-hole with an insulating material.

Referring to 16A to 16C, second sacrificial insulating layers 218 and second interlayer insulating layers 220 may be alternately stacked on the first stack structure ST1 to form a second stack structure ST2, and then channel structures CH may be formed in an upper separation region SS, penetrating through the stack structure ST2 in the first region R1 and a second region R2, and in the first region R1.

Similarly to the first stack structure ST1, the second stack structure ST2 may be formed by alternately stacking the interlayer insulating layers 220 and the second sacrificial insulating layers 218. A first upper insulating layer 290 may be formed to cover upper portions of the stack structures ST1 and ST2 of the sacrificial insulating layers 118 and 218 and the interlayer insulating layers 120 and 220.

The second sacrificial insulating layers 218 may be replaced with second gate electrodes 230 in a subsequent process. The second sacrificial insulating layers 218 may be formed of, include, or consist of a material different from a material of the second interlayer insulating layers 220. For example, the second interlayer insulating layer 220 may be formed of or include or consist of at least one of a silicon oxide and a silicon nitride, and the second sacrificial insulating layers 218 may be formed of or include or consist of a material, different from a material of the second interlayer insulating layer 220, selected from the group including consisting of silicon, a silicon oxide, a silicon carbide, and a silicon nitride. In some example embodiments, thicknesses of the second interlayer insulating layers 220 may not all be the same.

The upper separation region SS may be formed by removing some of the second sacrificial insulating layers 218 and the interlayer insulating layers 220 in the first region R1 and the second region R2. The upper separation region SS may be formed by exposing a region in which the upper separation region SS is to be formed, using an additional mask layer, removing a predetermined number of second sacrificial insulating layers 218 and interlayer insulating layers 220 from an uppermost portion, and depositing an insulating material. The upper separation region SS may extend downwardly of a region, in which the upper gate electrodes 230U of FIG. 4 are formed, in a direction Z.

Similarly to the case of first stack structure ST1, an etching process may be performed in a location corresponding to the second channel structure CH2 in the first region R1 such that a through-hole may be formed to penetrate through the second stack structure ST2. A sidewall of the through-hole, penetrating through the second stack structure ST2, may not be perpendicular to an upper surface of the first stack structure ST1 due to a height of the second stack structure ST2. Accordingly, widths of the upper surfaces of the through-sacrificial layers 119 and a lower portion of the through-hole of the second stack structure ST1 may be discontinuous. The channel structures CH may be formed by removing the through-sacrificial layers 119 of the first stack structure ST1 to form channel through-holes extending from the first stack structure ST1 to the second stack structure ST2 and filling the channel through-holes. As described in FIGS. 15A to 16C, since the channel structures CH are formed by two etching processes, respectively performed in the first and second stack structures ST1 and ST2, the channel structures CH may have a bent portion on a boundary between the first and second stack structure ST1 and ST2. In addition, since the channel structures CH are formed in only the first region R1 other than the second and third regions R2 and R2, to be stably formed, electrical reliability of a semiconductor may be improved.

Referring to FIGS. 17A to 17C, a second upper insulating layer 292 may be stacked on the first upper insulating layer 290, and dummy structures DS may be formed in the second region R2 and the third region R3.

The dummy structures DS may be formed by forming holes to simultaneously penetrate through the first and second upper insulating layers 290 and 292 and the first and second stack structures ST1 and ST2 in the second region R2 and the third region R3 and filling the holes with an insulating material. The dummy structures DS may be formed to have greater widths than the channel structures CH, and the dummy structures DS may be disposed such that a distance between the dummy structures DS is greater than a distance between channel structures CH. The dummy structures DS may simultaneously penetrate through the first stack structure ST1 and the second stack structure ST2, and may have widths continuously decreased from upper ends of the dummy structures DS to lower ends of the dummy structures.

Figure 18A:
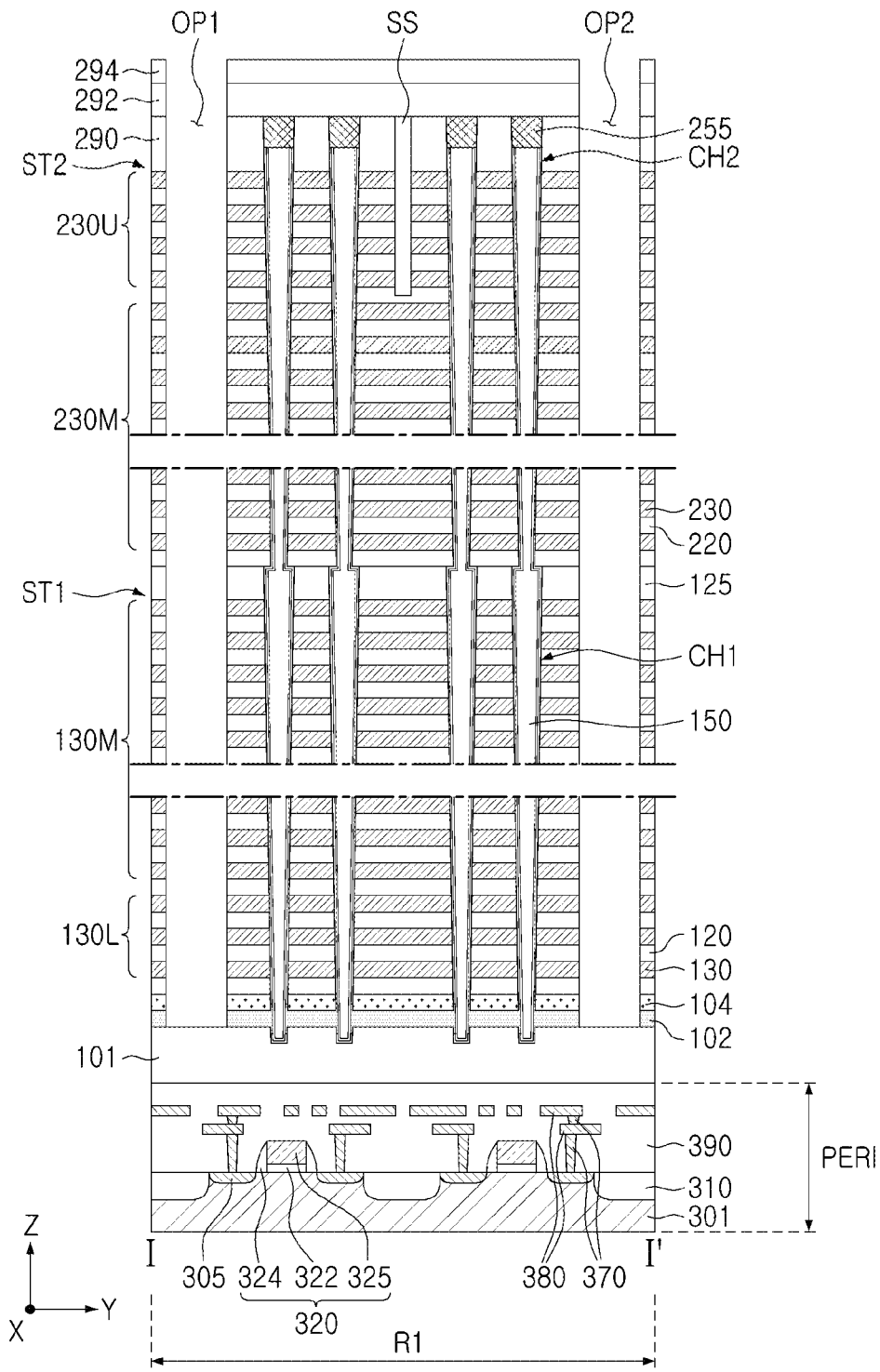
Figure 18B:
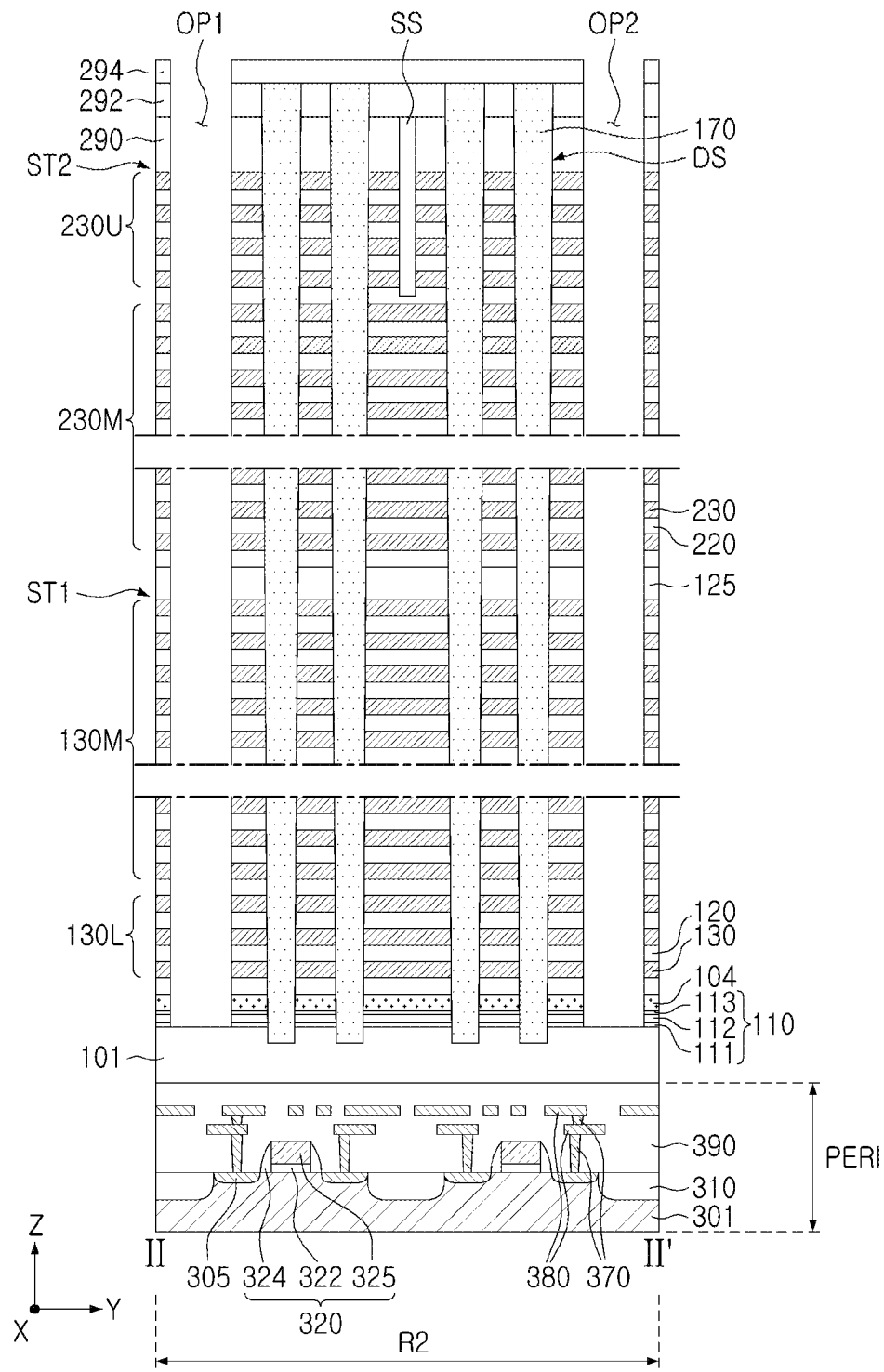
Figure 18C:
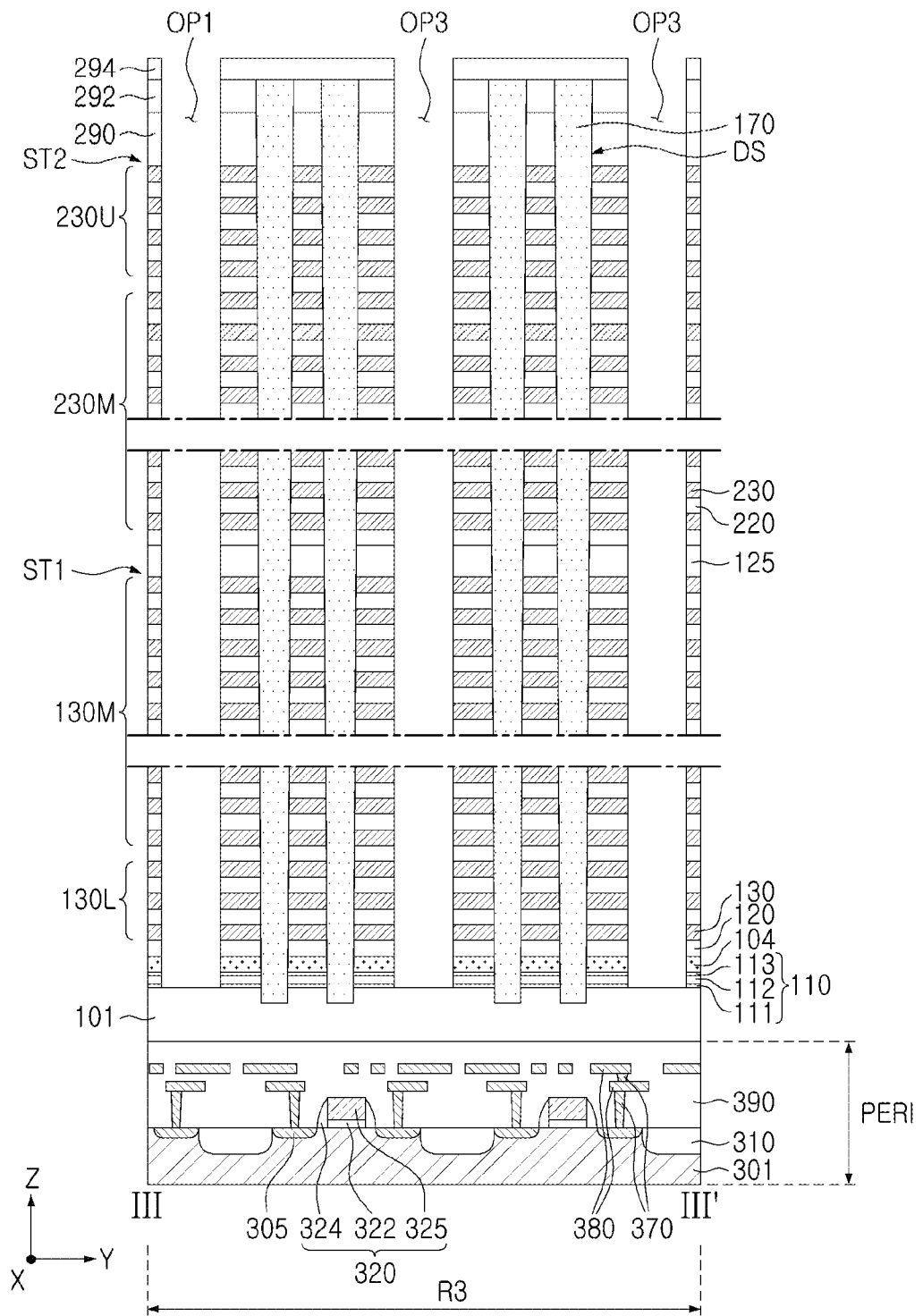

Referring now to FIGS. 18A to 18C, a third upper insulating layer 293 may be stacked on the second upper insulating layer 292, and first to third openings OP1, OP2, and OP3 may be formed to penetrate through stack structures. The first to third horizontal insulating layers 111, 112 and 113 may be removed in the first region R1 through the first to third openings OP1, OP2, and OP3, and then a first horizontal conductive layer 102 may be formed, and sacrificial insulating layers 118 and 218 may be replaced with a conductive material to form gate electrodes 130 and 230.

The first opening OP1, extending in the direction X in the first to third regions R1, R2, and R3, may be formed by performing an etching process on the first to third upper insulating layers 290, 292, and 294 and the stack structures ST1 and ST2 in a region corresponding to the main separation regions MS1 of FIGS. 4 to 6. The second opening OP2, extending in the direction X in the first and second regions R1 and R2, may be formed by performing an etching process on the first to third upper insulating layers 290, 292, and 294 and the stack structures ST1 and ST2 in a region corresponding to the first auxiliary separation regions MS2a of FIGS. 4 and 5. The third opening OP3, extending in the direction X in the third region R2, may be formed by performing an etching process on the first to third upper insulating layers 290, 292, and 294 and the stack structures ST1 and ST2 in a region corresponding to the second auxiliary separation regions MS2b of FIG. 6.

The first to third openings OP1, OP2, and OP3 may be formed to have substantially the same width, and may be formed such that a distance from a center of the first opening OP1 to a center of the second opening OP2 in the direction Y is greater than a distance from the center of the first opening OP1 to a center of the third opening OP3 in the direction Y.

The second horizontal insulating layer 112 may be exposed by performing an etch-back process while forming additional sacrificial spacer layers in the openings OP1, OP2, and OP3. The second horizontal insulating layer 112 may be selectively removed from the exposed region, and then the first and third horizontal insulating layers 111 and 113 disposed above the exposed region and below the exposed region may be removed.

The first to third horizontal insulating layers 111, 112, and 113 may be removed by, for example, an isotropic process such as a wet etching process including a chemical such as hydrogen fluoride and/or nitric acid and/or phosphoric acid. A portion of the gate dielectric layer 145, exposed in the region in which the second horizontal insulating layer 112 is removed, may also be removed during the process of removing the first and third horizontal insulating layers 111 and 113. A conductive material may be deposited on the region, in which the first to third horizontal insulating layers 111, 112, and 113 are removed, to form a first horizontal conductive layer 102, and then the sacrificial spacer layers may be removed in the openings.

The sacrificial insulating layers 118 and 218 may be selectively removed with respect to the interlayer insulating layers 120 and 220 and the second horizontal conductive layer 104 using a wet etching process. Accordingly, a plurality of tunnel portions may be formed between the interlayer insulating layers 120 and 220. A conductive material, forming the gate electrodes 130 and 230, may fill tunnel portions. The conductive material may include a metal, doped or undoped polysilicon, and/or a metal silicide material.

Returning to FIGS. 4 to 6, a separation insulating layer 185 may be formed in the openings OP1, OP2, and OP3 to form a main separation region MS1, a first auxiliary separation region MS2a, and a second auxiliary separation region MS2b.

Figure 19:
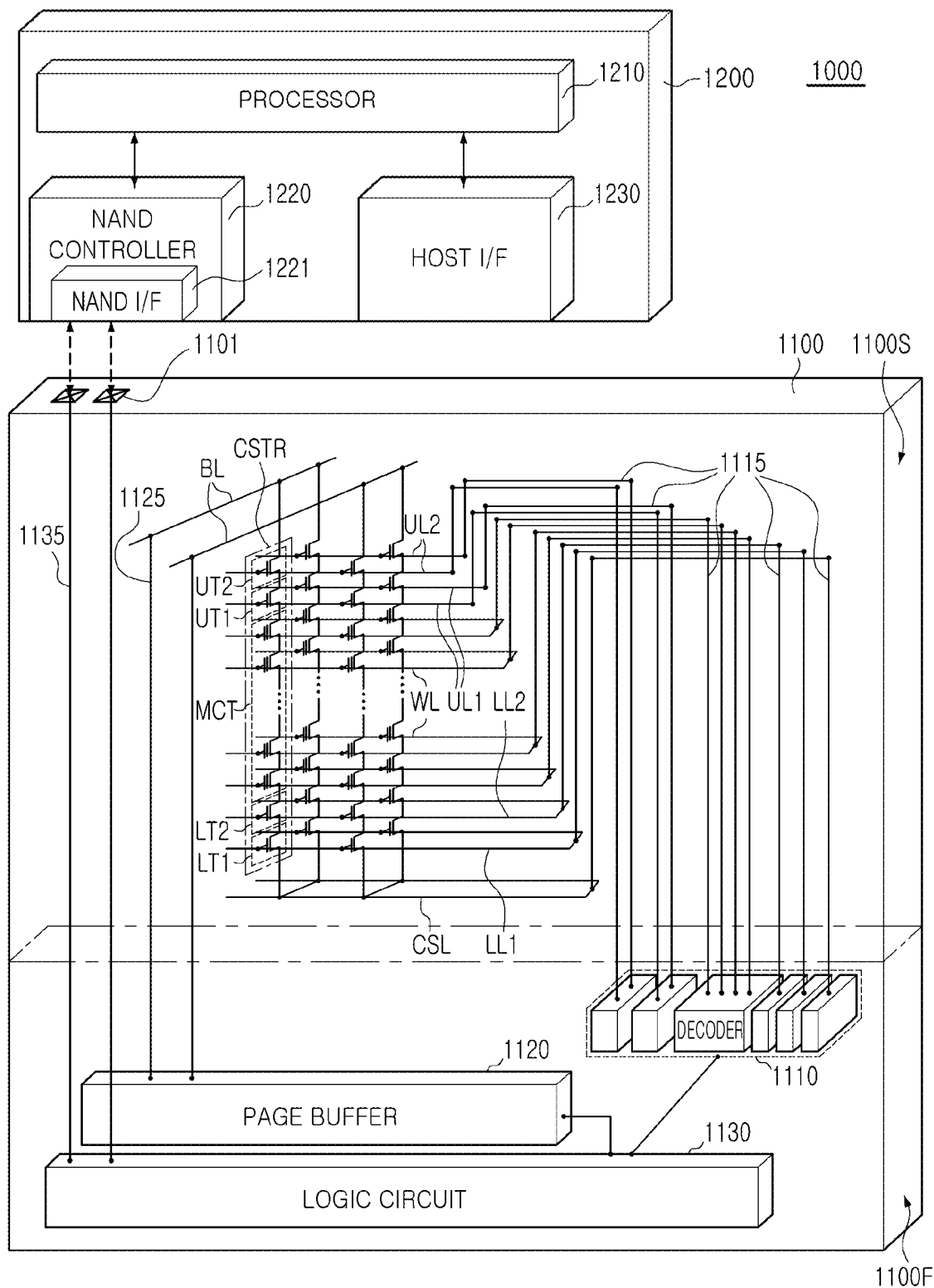
FIG. 19 is a schematic diagram of an electronic system including a semiconductor device according to some example embodiments.

FIG. 19 is a schematic diagram of an electronic system including a semiconductor device according to an example embodiment.

Referring to FIG. 19, an electronic system 1000 according to some example embodiments may include a semiconductor device 1100 and a controller 1200 electrically connected to the semiconductor device 1100. The electronic system 1000 may be or include a storage device including one or more semiconductor devices 1100, or an electronic device including a storage device. For example, the electronic system 1000 may be or include a solid state drive device (SSD) device, a universal serial bus (USB), a computing system, a medical device, or a communications device, including one or more semiconductor devices 1100.

The semiconductor device 1100 may be a nonvolatile memory device, for example, a NAND flash memory device described with reference to FIGS. 1 to 14. The semiconductor device 1100 may include a first structure 1100f and a second structure 1100s on the first structure 1100f. In some example embodiments, the first structure 1100f may be disposed next to the second structure 1100s. The first structure 1100f may be or include a peripheral circuit structure including a decoder circuit 1110, a page buffer 1120, and a logic circuit 1130. The second structure 1100s may a memory cell structure including a bitline BL, a common source line CSL, wordlines WL, first and second upper gate lines UL1 and UL2, first and second lower gate lines LL1 and LL2, and memory cell strings CSTR between the bitline and the common source line CSL.

In the second structure 1100s, each of the memory cell strings CSTR may include lower transistors LT1 and LT2 adjacent to the common source line CSL, upper transistors adjacent to the bitline BL, and a plurality of memory cell transistors MCT disposed between the lower transistors LT1 and LT2 and upper transistors UT1 and UT2. The number of lower transistors LT1 and LT2 and/or the number of upper transistors UT1 and UT2 may be changed in various ways according to some example embodiments.

In some example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The wordlines WL may be or correspond to gate electrodes of the memory cell transistors MCT, respectively. The upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used in an erase operation to erase data, stored in the memory cell transistors MCT, using gate-induced drain leakage (GIDL).

The common source line CSL, the first and second lower gate lines LL1 and LL2, the wordlines WL, and the first and second upper gate lines UL1 and UL2 may be electrically connected to the decoder circuit 1110 through first interconnection lines 1115 extending from the first structure 1100f to the second structure 1100s. The bitlines BL may be electrically connected to the page buffer 1120 through second interconnection lines 1125 extending from the first structure 1100F to the second structure 1100S.

In the first structure 1100f, the decoder circuit 1110 and the page buffer 1120 may perform a control operation on at least one selected memory cell transistor, among the plurality of memory cell transistors MCT. The decoder circuit 1110 and the page buffer 1120 may be controlled by the logic circuit 1130. The semiconductor device 1000 may communicate with the controller 1200 through an input/output pad 1101 electrically connected to the logic circuit 1130. The input/output pad 1101 may be electrically connected to the logic circuit 1130 through an input/output interconnection line 1135 extending from the first structure 1100f to the second structure 1100s.

The controller 1200 may be or include a processor 1210, a NAND controller 1220, and a host interface 1230. According to some example embodiments, the electronic system 1000 may include a plurality of semiconductor devices 1100. In this case, the controller 1200 may control the plurality of semiconductor devices 1000.

The processor 1210 may control all operations of the electronic system 1000 including the controller 1200. The processor 1210 may operate based on specific (or, alternatively, predetermined) firmware, and may control the NAND controller 1220 to access the semiconductor device 1100. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, and the like, may be transmitted through the NAND interface 1221. The host interface 1230 may provide a communications function between the electronic system 1000 and an external host. When a control command is received from the external host through the host interface 1230, the processor 1210 may control the semiconductor device 1100 in response to the control command.

Figure 20:
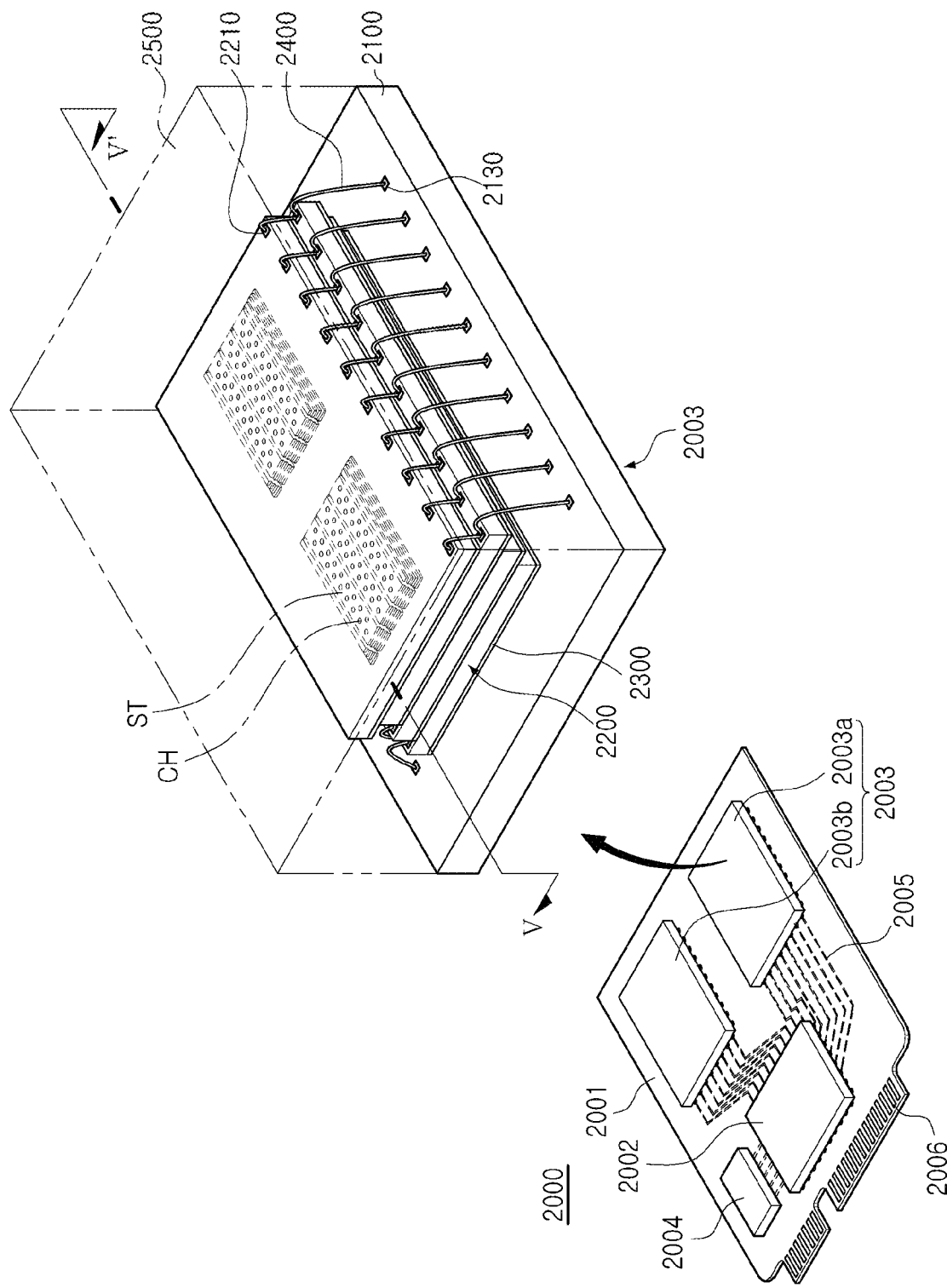
FIG. 20 is a schematic perspective view of an electronic system including a semiconductor device according to some example embodiments.

FIG. 20 is a schematic perspective view of an electronic system including a semiconductor device according to some example embodiments.

Referring to FIG. 20, an electronic system 2000 according to some example embodiments of the present invention includes a main substrate 2001, a controller 2002 mounted on the main substrate 2001, and one or more semiconductor packages 2003, and DRAM 2004. The semiconductor package 2003 and the DRAM 2004 may be connected to the controller 2002 by interconnection patterns 2005 formed on the main substrate 2001.

The main board 2001 may include a connector 2006 including a plurality of pins connected to an external host. The number and arrangement of the plurality of pins in the connector 2006 may vary depending on a communications interface between the electronic system 2000 and the external host. In some example embodiments, the electronic system 2000 may communicate with the external host according to at least one of interfaces such as a universal serial bus (USB), a peripheral component interconnect express (PCI-Express), a serial advanced technology attachment (SATA), M-PHY for a universal flash storage (UFS), and the like. The electronic system 2000 may communicate with an external host according to any one of the interfaces. In some example embodiments, the electronic system 2000 may operate using power supplied from an external host through the connector 2006. The electronic system 2000 may further include a power management integrated circuit (PMIC) distributing power, supplied from the external host, to the controller 2002 and the semiconductor package 2003.

The controller 2002 may write data to the semiconductor package 2003, or may read data from the semiconductor package 2003. The controller 2002 may improve operation speed of the electronic system 2000.

The DRAM 2004 may be a buffer memory for reducing a difference in speeds between the semiconductor package 2003, a data storage space, and the external host. The DRAM 2004, included in the electronic system 2000, may also operate as a type of cache memory, and/or may provide a space for temporarily storing data in a control operation on the semiconductor packages 2003. When the DRAM 2004 is included in the electronic system 2000, the controller 2002 may further include a DRAM controller for controlling the DRAM 2004, in addition to a NAND controller for controlling the semiconductor packages 2003.

The semiconductor package 2003 may include first and second semiconductor packages 2003a and 2003b disposed to be spaced apart from each other. Each of the first and second semiconductor packages 2003a and 2003b may be or may include a semiconductor package including a plurality of semiconductor chips 2200. Each of the first and second semiconductor packages 2003a and 2003b may include a package substrate 2100, semiconductor chips 2200 on the package substrate 2100, adhesive layers 2300, respectively disposed on lower surfaces of the semiconductor chips 2200, a connection structure 2400 electrically connecting the semiconductor chips 2200 and the package substrate 2100 to each other, and a molding layer 2500 covering the semiconductor chips 2200 and the connection structure 2400 on the package substrate 2100.

The package substrate 2100 may be or may include a printed circuit board (PCB) including upper package pads 2130. Each of the semiconductor chips 2200 may include an input/output pad 2210. The input/output pad 2210 may correspond to the input/output pad 1101 of FIG. 19. Each of the semiconductor chips 2200 may include first and second stack structures ST1 and ST2 and channel structures CH.

Each of the semiconductor chips 2200 may include the semiconductor device described with reference to FIGS. 1 to 14.

In some example embodiments, the connection structure 2400 may be a bonding wire electrically connecting the input/output pad 2210 and the package upper pads 2130 to each other. Accordingly, in each of the first and second semiconductor packages 2003a and 2003b, the semiconductor chips 2200 may be electrically connected to each other using wire bonding, and may be electrically connected to the upper package pads 2130 of the package substrate 2100. According to some example embodiments, in each of the first and second semiconductor packages 2003a and 2003b, the semiconductor chips 2200 may be electrically connected to each other by a connection structure having a through-silicon via (TSV), rather than the connection structure 2400 using the wire bonding.

In some example embodiments, the controller 2002 and the semiconductor chips 2200 may be included in a single package. In some example embodiments, the controller 2002 and the semiconductor chips 2200 are mounted on an additional interposer substrate different from the main substrate 2001, and the controller 2002 and the semiconductor chips 2200 may be connected to each other by a wiring formed in the interposer substrate.

Figure 21:
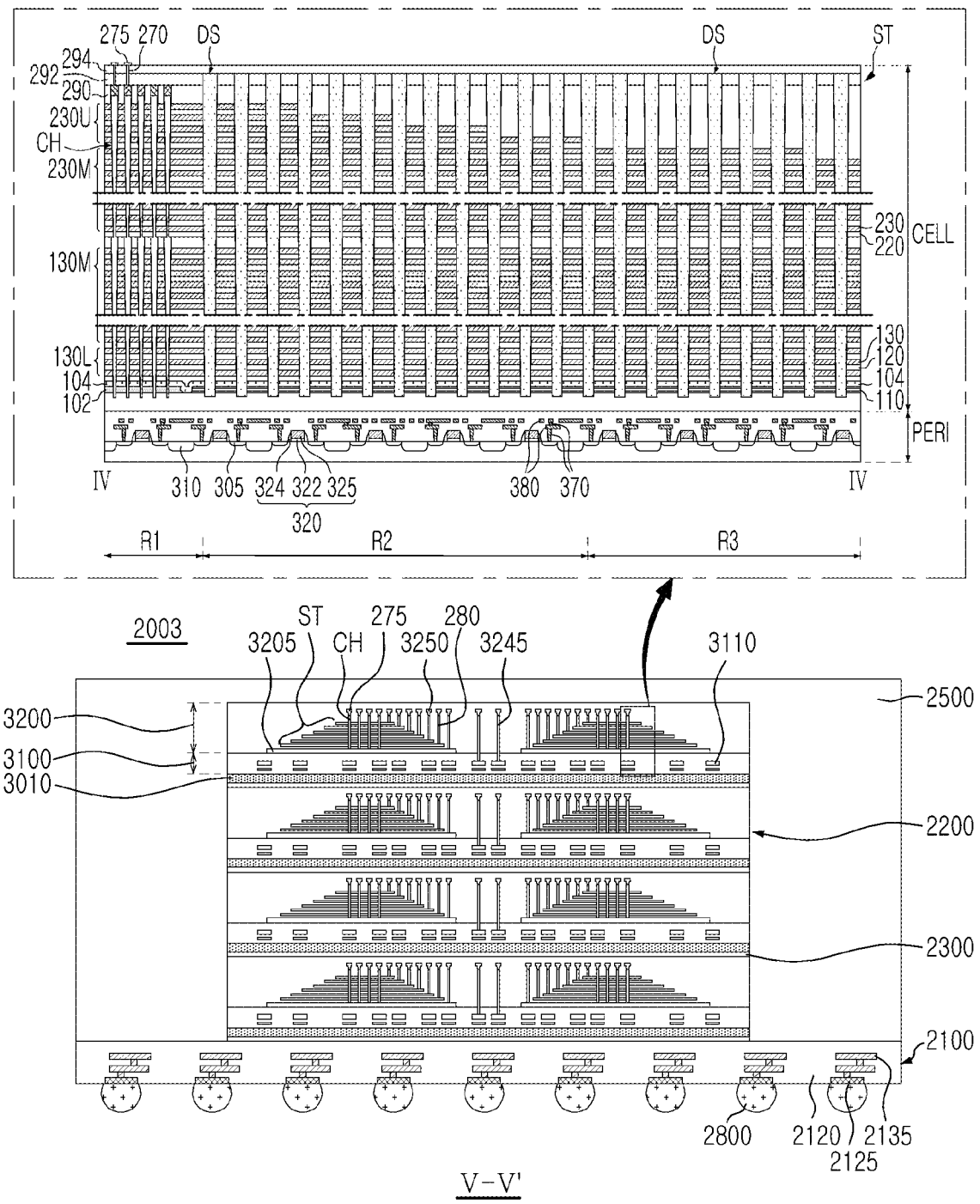
FIG. 21 is a schematic cross-sectional view of a semiconductor package according to some example embodiments.

FIG. 21 is a schematic cross-sectional view of a semiconductor package according to some example embodiments.

FIG. 21 illustrates an example embodiment of the semiconductor package 2003 of FIG. 20, and conceptually illustrates a region taken along line V-V' of the semiconductor package 2003 of FIG. 20.

Referring to FIG. 21, in a semiconductor package 2003, a package substrate 2100 may be a printed circuit board (PCB). The package substrate 2100 may include a package substrate body portion 2120, the upper package pads (2130 in FIG. 20) disposed on an upper surface of the package substrate body portion 2120, lower package pads 2125 disposed on a lower surface of the package substrate body portion 2120 or exposed through the package substrate body portion 2120, and internal wirings 2135 electrically connecting the upper package pads 2130 and the lower package pads 2125 to each other. The upper package pads 2130 may be electrically connected to a connection structures 2400. The lower package pads 2125 may be connected to wiring patterns 2005 of the main substrate 2010 of the electronic system 2000 through conductive connection portions 2800, as illustrated in FIG. 20.

Each of the semiconductor chips 2200 may include a semiconductor substrate 3010 and a first structure 3100 and a second structure 3200 sequentially stacked on the semiconductor substrate 3010. The first structure 3100 may have a peripheral circuit region including peripheral interconnections 3110. The second structure 3200 includes a common source line 3205, a stack structure ST on the common source line 3205, channel structures CH penetrating through the stack structure ST, bitlines 275 electrically connected to the channel structure CH, and gate interconnection lines 3235 electrically connected to wordlines (WL of FIG. 19) of the stack structure ST.

As illustrated in the enlarged view, in each of the first structure 3100, the second structure 3200, and the semiconductor chips 2200, the substrate 101 may include a first region, in which the channel structures CH are disposed, and a second region R2 and a third region R3 corresponding staircase regions. In addition, each of the first structure 3100, the second structure 3200, and the semiconductor chips 2200 may be disposed in the second and third regions R2 and R3, and may further include dummy structures DS, each having a width greater than a width of each of the channel structures CH.

Each of the semiconductor chips 2200 may include a through-interconnection 3245 electrically connected to the peripheral interconnections 3110 of the first structure 3100 and extending inwardly of the second structure 3200. The through-interconnection 3245 may disposed outside the stack structure ST and may be further disposed to penetrate through the stack structure ST. Each of the semiconductor chips 2200 may further include an input/output pad 2210 of FIG. 20) electrically connected to the peripheral interconnections 3110.

As described above, auxiliary separation regions of a memory cell region and auxiliary separation regions of a staircase region may be arranged at different pitches to provide a semiconductor device having improved reliability and an electronic system including the same.

Although some example embodiments have been described above with respect to various figures, unless clear from context various embodiments are not meant to be mutually exclusive with one another. For example a semiconductor device may have some features described with reference to one figure, and also may have some features described with reference to another figure.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been shown and described above, it will be apparent to those of ordinary skill in the art that modifications and variations could be made without departing from the scope of inventive concepts as defined by the appended claims.

What is claimed is:
1. A semiconductor device comprising:
  a substrate having a first region, a second region, and a third region;
  a first stack structure including first gate electrodes stacked to be spaced apart from each other, and first interlayer insulating layers alternately stacked with the first gate electrodes;
  a second stack structure on the first stack structure and including second gate electrodes and second interlayer insulating layers stacked alternately with the second gate electrodes; the second gate electrodes stacked to be spaced apart from each other in the first region and extending in a first direction while arranged in a staircase shape in the first direction, the staircase shape in the second region and the third region;
  main separation regions in the first to third regions, the main separation regions penetrating the first and second stack structures, the main separation regions extending in the first direction and spaced apart from each other in a second direction that is perpendicular to the first direction;
  first auxiliary separation regions in the first and second regions, the first auxiliary separation regions penetrating the first and second stack structures between the main separation regions, the first auxiliary regions extending in the first direction and spaced apart from each other in the second direction;

second auxiliary separation regions in the third region, the second auxiliary separation regions penetrating the first and second stack structures between the main separation regions, the second auxiliary separation regions extending in the first direction and spaced apart from each other in the second direction;

first channel structures and second channel structures, each of the first channel structures and second channel structures including a channel layer and having a first width, the first channel structures and the second channel structures penetrating the first stack structure and the second stack structure, respectively; and dummy structures penetrating the first and second stack structures and having a second width greater than the first width, wherein the first auxiliary separation regions are arranged at a first pitch in the second direction between the main separation regions, and the second auxiliary separation regions are arranged at a second pitch in the second direction between the main separation regions, the second pitch less than the first pitch.

2. The semiconductor device of claim 1, wherein the first and second channel structures are between the first auxiliary separation regions in the first region, and the dummy structures are between the first auxiliary separation regions in the second region, and are between the second auxiliary separation regions in the third region.

3. The semiconductor device of claim 1, wherein the first and second channel structure are between the first auxiliary separation regions, and the dummy structures are between the second auxiliary separation regions.

4. The semiconductor device of claim 1, wherein the first and second channel structures are between the first auxiliary separation regions in the first region, and the dummy structures are between the first auxiliary separation regions in a portion of the first region adjacent to the second region and the second region, and are between the second auxiliary separation regions in the third region.

5. The semiconductor device of claim 1, wherein a distance between the second channel structures is less than a distance between the dummy structures.

6. The semiconductor device of claim 1, further comprising:

lower separation regions between the main separation regions and penetrating through at least one first gate electrode, the at least one first gate electrode including a lowermost gate electrode among the first gate electrodes, the lower separation regions connecting at least one of the first auxiliary separation regions with one of the second auxiliary separation regions that is adjacent to the at least one of the first auxiliary separation regions.

7. The semiconductor device of claim 6, wherein each of the lower separation regions includes a first portion in a direction horizontal to the first auxiliary separation regions, and a second portion in a direction perpendicular to the second auxiliary separation regions.

8. The semiconductor device of claim 1, wherein the dummy structures include an insulating material.

9. The semiconductor device of claim 1, wherein each of the first and second channel structures further includes a gate dielectric layer between the gate electrodes and the channel layer, and a channel-filling insulating layer in the channel layer.

10. The semiconductor device of claim 1, wherein the second width of each of the dummy structures is more than about twice the first width of each of the channel structures.

11. The semiconductor device of claim 1, wherein the semiconductor device includes a bent portion connecting upper ends of the first channel structures with lower ends of the second channel structures, and each of the dummy structures has a width continuously decreasing from an upper portion of the second stack structure to a lower portion of the first stack structure.

12. The semiconductor device of claim 1, further comprising:

upper separation regions in the first region and the second region, the upper separation regions penetrating a portion of upper portions of the second stack structure and alternating with the first auxiliary separation regions in the second direction, wherein in the second direction a distance from a center of the main separation region to a center of the second auxiliary separation region is greater than a distance from the center of the main separation region to a center of the upper separation region.

13. The semiconductor device of claim 1, wherein each of the dummy structures has a shape different from a shape of each of the first and second channel structure, when viewed in a plan view.

14. A semiconductor device comprising:

a substrate having a first region, a second region, and a third region;

a stack structure including a plurality of gate electrodes stacked and spaced apart from each other on the first region and extending in a first direction while arranged in a staircase shape on the second region and on the third region;

channel structures, each penetrating through the stack structure and including a channel layer;

main separation regions in the first to third regions, the main separation regions penetrating the stack structure, extending in the first direction, and spaced apart from each other in a second direction that is perpendicular to the first direction;

first auxiliary separation regions in the first region and the second region, the first auxiliary separation regions penetrating the stack structure between the main separation regions, extending in the first direction, and spaced apart from each other in the second direction;

second auxiliary separation regions in the third region, the second auxiliary separation regions penetrating the stack structure between the main separation regions, extending in the first direction, and spaced apart from each other in the second direction; and first lower separation regions between the main separation regions and penetrating at least one gate electrode, the at least one gate electrode including a lowermost gate electrode among the gate electrodes, the first lower separation regions between at least one of the first auxiliary separation regions and one of the second auxiliary separation regions that is adjacent to the at least one of the first auxiliary separation regions and connecting the at least one of the first auxiliary separation regions with the one of the second auxiliary separation regions, wherein the first auxiliary separation regions are arranged at a first pitch in the second direction between the main separation regions, the second auxiliary separation regions are arranged at a second pitch, less than the first pitch, in the second direction between the main separation regions, and the first auxiliary separation regions and the second auxiliary separation regions are shifted from each other in the second direction.

15. The semiconductor device of claim 14, wherein each of the first lower separation regions includes a first portion arranged in a direction horizontal to the first auxiliary separation regions, and a second portion arranged in a direction perpendicular to the second auxiliary separation regions.

16. The semiconductor device of claim 14, wherein two of the first lower separation regions that are between the main separation regions are symmetrical with respect to a center between the main separation regions in the second direction.

17. The semiconductor device of claim 14, further comprising:
a second lower separation region penetrating at least one gate electrode, the at least one gate electrode including a lowermost gate electrode among the plurality of gate electrodes, the second lower separation region adjacent to a region in which the second auxiliary separation regions are spaced apart from each other in the second direction and connecting the second auxiliary separation regions are spaced apart from each other in the second direction.

18. The semiconductor device of claim 14, wherein each of the channel structures has a first width and is between the first auxiliary separation regions in the first region,
the semiconductor device includes dummy structures penetrating through the stack structure and each having a second width greater than the first width, and
the dummy structures are between the first auxiliary separation regions in the second region, and are between the second auxiliary separation regions in the third region.

19. An electronic system comprising:
a semiconductor storage device including a first substrate;
active or passive circuits on the first substrate;
a second substrate on the active or passive circuits and having a first region, a second region, and a third region;
a stack structure including a plurality of gate electrodes stacked and spaced apart from each other on the second substrate of the first to third regions and extending in a first direction and arranged in a staircase shape in the first direction, the staircase shape in the second region and the third region, the stack structure including first interlayer insulating layers alternately stacked with the gate electrode;
channel structures, each penetrating the stack structure and including a channel layer;
main separation regions penetrating the stack structure, the main separation regions extending in the first direction, and spaced apart from each other in a second direction, perpendicular to the first direction, the main separation regions on the second substrate on the first to third regions;
first auxiliary separation regions penetrating the stack structure between the main separation regions, the first auxiliary separation regions extending in the first direction, and spaced apart from each other in the second direction, the first auxiliary separation regions in the first region and the second region;
second auxiliary separation regions penetrating the stack structure between the main separation regions, the second auxiliary separation regions extending in the first direction and spaced apart from each other in the second direction, the second auxiliary separation regions in the third region;
first lower separation regions between the main separation regions and penetrating at least one gate electrode, the at least one gate electrode including a lowermost gate electrode from among the plurality of gate electrodes, the first lower separation regions between at least one of the first auxiliary separation regions and one of the second auxiliary separation regions that is adjacent to the at least one of the first auxiliary separation regions and connecting the at least one of the first auxiliary separation regions with the one of the second auxiliary separation regions;
an input/output pad electrically connected to the active or passive circuits; and
a controller circuitry electrically connected to the semiconductor storage device through the input/output pad and configured to control the semiconductor storage device,
wherein in the semiconductor storage device, the first auxiliary separation regions are arranged at a first pitch in the second direction between the main separation regions, and the second auxiliary separation regions are arranged at a second pitch, less than the first pitch, in the second direction between the main separation regions.

20. The electronic system of claim 19, wherein the semiconductor storage device further comprises:
upper separation regions penetrating a portion of upper portions of the stack structure and alternately arranged with the first auxiliary separation regions, the upper separation regions in the first and second regions; and
dummy structures, each penetrating through the stack structure,
wherein each of the channel structures has a first width, and each of the dummy structures has a second width greater than the first width.

* * * * *